US006648130B1

(12) United States Patent
Hasson et al.

(10) Patent No.: US 6,648,130 B1
(45) Date of Patent: Nov. 18, 2003

(54) HYPERPOLARIZED GAS TRANSPORT AND STORAGE DEVICES AND ASSOCIATED TRANSPORT AND STORAGE METHODS USING PERMANENT MAGNETS

(75) Inventors: Kenton C. Hasson, Durham, NC (US); William Happer, Princeton, NJ (US); Geri T. K. Zollinger, Chapel Hill, NC (US)

(73) Assignee: Medi-Physics, Inc., Princeton, NJ (US)

( * ) Notice: Subject to any disclaimer, the term of this patent is extended or adjusted under 35 U.S.C. 154(b) by 17 days.

(21) Appl. No.: 09/583,663

(22) Filed: May 30, 2000

Related U.S. Application Data

(60) Provisional application No. 60/148,359, filed on Aug. 11, 1999.

(51) Int. Cl.[7] .......................... B65D 85/00; F25B 21/00
(52) U.S. Cl. ........................ 206/0.7; 206/818; 62/3.1; 62/45.1; 62/914
(58) Field of Search ................ 206/0.7, 818; 62/3.1, 62/45.1, 914, 610, 919; 335/296, 302–306

(56) References Cited

U.S. PATENT DOCUMENTS

| 3,642,851 A | 2/1972 | Bennett ............... 260/448.2 N |
| 3,646,090 A | 2/1972 | Bennett ............... 260/448.2 E |
| 3,657,363 A | 4/1972 | Dorko .......................... 260/642 |
| 3,748,864 A | 7/1973 | Lofredo et al. ................. 62/22 |
| 3,919,678 A | * 11/1975 | Penfold ....................... 335/296 |
| 3,966,781 A | 6/1976 | Atkinson et al. ...... 260/410.9 R |
| 3,989,705 A | 11/1976 | Werstiuk et al. ......... 260/290 P |
| 4,080,429 A | 3/1978 | Koeppe et al. .............. 423/262 |
| 4,157,495 A | 6/1979 | Grover et al. ............ 324/0.5 F |
| 4,167,230 A | * 9/1979 | Barratt ........................ 206/380 |
| 4,369,048 A | 1/1983 | Pence ............................. 55/66 |
| 4,385,086 A | 5/1983 | Nakayama et al. ......... 427/387 |
| 4,417,909 A | 11/1983 | Weltmer, Jr. .................... 62/12 |
| 4,450,407 A | 5/1984 | Kwon et al. ................ 324/304 |
| 4,466,442 A | 8/1984 | Hilmann et al. ............ 128/653 |
| 4,599,462 A | 7/1986 | Michl .......................... 568/702 |

(List continued on next page.)

FOREIGN PATENT DOCUMENTS

| DE | 19742548 A | 4/1999 |
| EP | 0602447 A2 | 10/1994 |

(List continued on next page.)

OTHER PUBLICATIONS

PCT International Search Report, International Appl. No. PCT/US00/21283, mailed 30/11/00.

(List continued on next page.)

Primary Examiner—J. Mohandesi
(74) Attorney, Agent, or Firm—Myers, Bigel, Sibley & Sajovec

(57) ABSTRACT

A transport unit includes a plurality of permanent magnets arranged to provide a magnetic holding field for protecting hyperpolarized gas during storage and/or transport. The permanent magnets are configured in a relatively light weight manner to project a substantially cylindrical magnetic holding field or spherical holding field in space. The magnet arrangements can include primary magnets and field shaping secondary magnets which act to enlarge the region of homogeneity. The permanent magnet arrangement can also be provided with a cylindrical shaped flex sheet magnetically activated to provide the magnetic holding field. The permanent magnet arrangements do not require disassembly to insert or remove one or more containers of hyperpolarized gas in or out of the transport unit.

51 Claims, 19 Drawing Sheets

U.S. PATENT DOCUMENTS

| | | | |
|---|---|---|---|
| 4,755,201 A | | 7/1988 | Eschwey .................... 62/12 |
| 4,758,813 A | * | 7/1988 | Holsinger et al. .......... 335/306 |
| 4,786,302 A | | 11/1988 | Osafune et al. .............. 65/3.11 |
| 4,793,357 A | | 12/1988 | Lindstrom .................. 128/654 |
| 4,862,359 A | | 8/1989 | Trivedi et al. .......... 364/413.05 |
| 4,914,160 A | | 4/1990 | Azizian .................... 525/329.3 |
| 4,977,749 A | | 12/1990 | Sercel ........................ 62/51.1 |
| 4,996,041 A | | 2/1991 | Arai et al. ..................... 424/9 |
| 5,007,243 A | | 4/1991 | Yamaguchi et al. ......... 62/51.1 |
| 5,008,219 A | | 4/1991 | Hara ........................... 501/12 |
| 5,039,500 A | | 8/1991 | Shino et al. ................ 423/262 |
| 5,161,382 A | | 11/1992 | Missimer ..................... 62/46.1 |
| 5,190,744 A | | 3/1993 | Rocklage et al. .............. 424/9 |
| 5,323,136 A | * | 6/1994 | Oue et al. .................... 335/301 |
| 5,352,979 A | | 10/1994 | Conturo ....................... 324/307 |
| 5,357,959 A | | 10/1994 | Fishman .................. 128/653.2 |
| 5,394,057 A | | 2/1995 | Russell et al. .............. 313/638 |
| 5,433,196 A | | 7/1995 | Fiat ............................. 128/632 |
| 5,438,264 A | * | 8/1995 | Takeshima et al. ......... 324/319 |
| 5,494,655 A | | 2/1996 | Rocklage et al. .......... 424/9.36 |
| 5,509,412 A | | 4/1996 | Bahn ....................... 128/653.2 |
| 5,526,927 A | * | 6/1996 | McLemore ........... 206/315.11 |
| 5,528,211 A | * | 6/1996 | Perreaut et al. ............. 335/296 |
| 5,617,860 A | | 4/1997 | Chupp et al. ............. 128/653.4 |
| 5,626,137 A | | 5/1997 | Dumoulin et al. ....... 128/653.2 |
| 5,637,507 A | | 6/1997 | Wicks et al. ................ 436/166 |
| 5,642,625 A | | 7/1997 | Cates, Jr. et al. ............ 62/55.5 |
| 5,660,276 A | * | 8/1997 | Winnard ..................... 206/350 |
| 5,809,801 A | | 9/1998 | Cates, Jr. et al. ............. 62/637 |
| 5,934,103 A | | 8/1999 | Ryan et al. .................... 62/637 |
| 5,936,404 A | | 8/1999 | Ladebeck et al. ........... 324/300 |
| 5,969,526 A | | 10/1999 | Duerr ......................... 324/318 |
| 6,006,906 A | * | 12/1999 | Winnard ..................... 206/350 |
| 6,023,162 A | | 2/2000 | Johnson ...................... 324/300 |
| 6,085,743 A | | 7/2000 | Rosen et al. ........... 128/200.24 |
| 6,128,918 A | * | 10/2000 | Deaton et al. ................ 62/610 |
| 6,269,648 B1 | * | 8/2001 | Hasson et al. ................ 62/3.1 |

FOREIGN PATENT DOCUMENTS

| | | |
|---|---|---|
| EP | 0933062 A2 | 8/1999 |
| WO | WO9414175 A | 6/1994 |
| WO | WO 97/10018 | 3/1997 |
| WO | WO9737239 | 10/1997 |
| WO | WO98/02209 A2 | 1/1998 |
| WO | WO98/43701 | 10/1998 |
| WO | WO99/08941 | 2/1999 |
| WO | WO 99/14582 | 3/1999 |
| WO | WO 99/17304 | 4/1999 |
| WO | WO 99/25243 | 5/1999 |
| WO | WO 99/52428 | 10/1999 |
| WO | WO99/66254 A1 | 12/1999 |
| WO | WO 99/66255 A2 | 12/1999 |
| WO | WO0020042 A | 4/2000 |
| WO | WO 00/21601 | 4/2000 |
| WO | WO 00/23797 | 4/2000 |
| WO | WO00/40972 | 7/2000 |

OTHER PUBLICATIONS

Romalis et al., "Accurate $^3$He Polarimetry Using the Rb Zeeman Frequency Shift Due to the Rb–$^3$He Spin–Exchange Collisions," Phys. Rev. A, vol. 58, No. 4, pp. 3004–3011 (Oct. 1998).

Albert et al., "$^{129}$Xe Relaxation Catalysis by Oxygen", Abstracts of the 11th Annual Meetings of the Society for Magnetic Resonance Medicine, Abstract No. 4710 (1992).

Albert et al., Measurement of $^{129}$Xe T1 in Blood to Explore the Feasibility of Hyperpolarized $^{129}$Xe MRI, Jour. Comp. Ass. Tomography, vol. 19, No. 6 (Nov.–Dec. 1995).

Albert et al., "Magnetic Resonance Imaging Using Hyperpolarized $^{129}$Xe," Medical Electronics, pp. 72–80 (Dec. 1994).

Albert et al., "Aqueous Shift Reagents for High–resolution Cation NMR. VI," Reprint from NMR in Biomedicine 6 7–20 (1993).

Altschuler et al., "Radiobiologic Models for Radiosurgery," Neurosurg. Clin. N. Am., vol. 3, No. 1, pp. 61–77 (Jan. 1992).

Arimoto, et al., "Development of Measurement and Control System for Polarized $^3$He Ion Source Based on Electron Pumping," The 11th Symposium on Accelerator Science and Technology, Harima Science Garden City, pp. 14–16 (1997).

Augustine et al., "Low Field Magnetic Resonance Images of Polarized Noble Gases Obtained with a dc Quantum Interference Device," App. Phys. Ltrs., vol. 72, No. 15, pp. 1908–1910 (Apr. 1998).

Bárány, M. et al., "High Resolution Proton Magnetic Resonance Spectroscopy of Human Brain and Liver," Magn. Reson. Imaging, 5:393 (1987).

Becker et al., "Study of Mechanical Compression of Spin–Polarized $^3$He Gas", Nuclear Instruments and Methods In Physics Research, vol. A 346, pp. 45–51 (1994).

Belliveau et al., "Functional Cerebral Imaging by Susceptibility–Contrast NMR," 14 Magnetic Resonance in Medicine 14, pp. 538–546 (1990).

Bhaskar et al., "Efficiency of Spin Exchange between Rubidium Spins and $^{129}$Xe Nuclei in a Gas", Physical Review Letters, vol. 49, No. 1, pp. 25–28 (Jul. 5, 1982).

Bifone, et al., "NMR of laser–polarized xenon in human blood," Proc. Natl. Acad. Sci. USA, vol. 93, pp. 12932–12936 (Nov. 1996).

Bishop et al., "High–Order Multipolar Hyperpolarizabilities with Imaginary Frequency for H and He," Int'l. Jour. Of Quan. Chem., vol. 59, pp. 103–108 (1996).

Bishop et al., "The Interaction Polarizatility and Interaction Second–Hyperpolarizability for He . . . He," Molecular Phys., vol. 88, No. 4, pp. 887–898 (1996).

Blumgart et al., "Studies on the Velocity of Blood Flow," J. Clin. Invest., 4:339–425 (1927).

Bock, "Simultaneous $T_2$* and Diffusion Measurements with $^3$He," Mag. Reson. In Med., vol. 38, No. 6, pp. 890–895 (1997).

Bouchiat et al., "Relaxation of Optically Pumped Rb Atoms on Paraffin–Coated Walls," Phys. Rev., vol. 147, No. 1 (Jul. 8, 1966).

Brochure, Jensen Inert Products, Gas Sampling Bags, Jensen@jenseninert.com (copyright 1997).

Brunner et al., "Communications: Gas Flow MRI Using Circulating Laser–Polarized $^{129}$Xe," J. Mag. Res. vol. 138, pp. 155–159 (1999).

Burt et al., "Fluorinated Anesthetics as Probes of Lipophilic Environments in Tumors," J. Magn. Reson., 53:163 (1983).

Burt et al., The Fluorinated Anesthetic Halothane as a Potential NMR Biologic Probe, Biochem. Biophys. Acta., 805:375 (1984).

Cain et al., "Nuclear Spin Relaxation Mechanisms and Mobility of Gases in Polymers," J. Phys. Chem., vol. 94, No. 5, pp. 2128–2135 (1990).

Carver, T.R., "Optical Pumping," Science, vol. 141, No. 3581, pp. 599–608 (1963).

Cates et al., "Rb–$^{129}$Xe spin–exchange rates due to binary and three–body collisons at High Xe pressures", Physical Review A, vol. 45, p. 4631 (1992).

Cates, "New Results from Spin–Exchange Optical Pumping", Am. Inst. Phys. pp. 3–15 (1998).

Chawla, et al., "In Vivo Magnetic Resonance Vascular Imaging Using Laser–Polarized 3He Microbubbles," Proc. Natl. Acad. Sci, vol. 95, pp. 10832–10835 (Sep. 1998).

Chen et al., "Oxygen enhanced MR ventilation imaging of the lung," Mag. Res. Mat'ls in Phys., Bio. & Med., vol. 7 pp. 153–161 (1998).

Chernikov et al., "1083nm Ytterbium Doped Fibre Amplifier for Optical Pumping of Helium," Elec. Ltrs., vol. 33, No. 9, 3 pages (Apr. 24, 1997).

Chupp et al., "Chemical Shift Imaging of Laser–Polarized $^{129}$XE Magnetization in Rats In Vivo," European Radiology, 9:B45 (1999).

Colegrove et al., Polarization of $He^3$ Gas by Optical Pumping,: Phys. Rev., vol. 132, No. 6, pp. 2561–2572 (1963).

Constantinesco et al., "MRI of Hyperpolarized Gases in Competition with Nuclear Medicine?" Médecine Nucléaire, vol. 21, No. 5, pp. 285–292 (1997–98) (French).

Cummings et al., "Optical pumping of Rb vapor using high–power $Ga_{1-x}A_x$ as diode laser arrays," Phys. Rev. A, vol. 51, No. 6, pp. 4842–4851 (1995).

Darrasse, et al., "Low–field $^3$He nuclear magnetic resonance in human lungs," C.R. Acad. Sci., Paris, t. 324, Series II b, pp. 691–700 (1997) (French).

Deninger et al., "Quantification of Regional Intrapulmonary Oxygen Partial Pressure Evolution during Apnea by $^3$He MRI," J. Mag. Res., vol. 141, pp. 207–216 (1999).

De Schepper, "The HERMES $^3$He target," AIP Conf. Proc., vol. 421, No. 1, pp. 16–25 (Jan. 1998).

Detre et al., "Measurement of Regional Cerebral Blood Flow in Cat Brain Using Intracartoid $^2H_2O$ and $^2H$ NMR Imaging," 14 Mag. Reson. In Med., pp. 389–395 (1990).

Diehl et al., "Nuclear Magnetic Relaxation of the $^{129}$Xe and $^{131}$Xe Isotopes of Xenon Gas Dissolved in Isotropic and Anisotropic Liquids," J. Magn. Reson., vol. 88, pp. 660–665 (1990).

Dodell, The Look of Lungs, NCRR Reporter, 3 pages (Nov./Dec. 1995), http://ch.nus.sg/MEDNEWS/feb96/hicn9095_7.htn.

Driehuys et al., "High–volume production of laser–polarized $^{129}$Xe," Appl. Phys. Lett., vol. 69, No. 12 (Sep. 16, 1996).

Eberle et al., "Analysis of intrapulmonary $O_2$ concentration by MR imaging of inhaled hyperpolarized helium–3," Am. Physiological Soc., pp. 2043–2052 (1999).

Eberle et al., "Determination of Regional Intrapulmonary Oxygen Concentration by Magnetic Resonance Imaging of inhaled Hyperpolarized $^3$Helium," Anesthesiology, vol. 89, No. 3A (Sep. 1998).

Ebert et al., "Nuclear magnetic resonance imaging with hyperpolarized helium–3," Lancet (NA ed), vol. 347, pp. 1297–1299 (May 1996).

Ernst et al., Chapter 10, "Nuclear Magnetic Resonance Imaging," Prin. of Nuclear Mag. Reson. in One and Two Dimensions, pp. 539–564 and 594–596 (1987).

Evers et al., "Correlation between the anaesthetic effect of halothane and saturable binding in brain," Nature, vol. 328, pp. 157–160 (Jul. 9, 1987).

Freed, "Dynamic Effects of Pair Correlation Functions on Spin Relaxation by Translational Diffusion in Liquids. II. Finite Jumps and Independent $T_1$ Processes," 68 J. Chem. Phys., vol. 9, pp. 4034–4037 (1978).

Gatzke et al., "Extraordinarily Slow Nuclear Spin Relaxation in Frozen Lazer–Polarized $^{129}$Xe", Phys. Rev. Lett., vol. 70, No. 5, pp. 690–693 (Feb. 1, 1993).

George, "The Sharper Image: MRIs and Xenon Gas," Jour. of NIH Res., vol. 6, No. 12, pp. 42–44 (Dec. 1994).

Glover et al., "Research Directions in MR Imaging[1]," Radiology, vol. 207, pp. 289–295, (1998).

Gregory et al., "Pore Structure Determinations of Silica Aerogels by $^{129}$Xe NMR Spectroscopy and Imaging," J. Mag. Reson., vol. 131, No. 2, pp. 327–335 (Apr. 1998).

Grover, "Noble–Gas NMR Detection through Noble–Gas–Rubidium Hyperfine Contact Interaction," Phys. Rev. Lett., vol. 40, No. 6, pp. 391–392 (1978).

Hadeishi et al., "Nuclear Alignment of the $^1S_0$ Ground State of $^{131}$Xe by Electron Pumping and Metastability–Exchange Collisions," Phys. Rev. Lett., vol. 19, p. 211–213 (1967).

Happer et al., "An Optical Pumping Primer," Hyperfine Interactions, vol. 38, pp. 435–470 (1987).

Happer et al., "Polarization of the nuclear spins of noble–gas atoms by spin exchange with optically pumped alkali–metal atoms," Phys. Rev. A, vol. 29, No. 6, p. 3092–3110 (Jun. 1984).

Hardy et al., "Broadband nuclear magnetic resonance pulses with two–dimensional spatial selectivity," J. Appl. Phys., vol. 66, No. 4, pp. 1513–1516 (Aug. 15, 1989).

Hardy et al., "Correcting for Nonuniform k–Space Sampling in Two–Dimensional NMR Selective Excitation," Jnl. Magnetic Resonance, vol. 87, pp. 639–645 (1990).

Hardy et al., "Spatial Localization in Two Dimensions Using NMR Designer Pulses," J. Magnetic Resonance, vol. 82, pp. 647–654 (1989).

Hou, et al., "Optimization of Fast Acquisition Methods for Whole–Brain Relative Cerebral Blood Volume (rCBV) Mapping with Susceptibility Contrast Agents," J. Mag. Res. Imaging, vol. 9 pp. 233–239 (1999).

Hunt et al., "Nuclear Magnetic Resonance of $^{129}$Xe in Natural Xenon," Phys. Rev., vol. 130, pp. 2302–2305 (Jun. 15, 1963).

Imai et al., "LCBF Values Decline While Lλ Values Increase During Normal Human Again Measured by Stable Xenon–enhanced Computed Tomography," Neuroradiology, vol. 30, pp. 463–472 (1988).

Jaduszliwer et al., "Optical spin polarization and state–sensitive detetion of a cesium atomic beam," Phys. Rev. A, vol. 48, No. 3, pp. 2102–2107 (Sep. 1993).

Jameson et al., "Nuclear Spin Relaxation by Intermolecular Magnetic Dipole Coupling in the Gas Phase. 129Xe in Oxygen," J. Chem. Phys., vol. 89, pp. 4074–4081 (1988).

Kaatz et al., "A comparison of molecular hyperpolarizabilities from gas and liquid," J. Chem. Phys., vol. 108, No. 3, pp. 849–856 (Jan. 15, 1998).

Kanal et al., Chapter 2 "Signal–to–Noise Ratio, Resolution, and Contrast," Biomedical Magnetic Imaging, pp. 47–114, VCH Publishers, New York (1988).

Kendall et al., "Xenon as a Contrast Agent for Computed Tomography," J. Neuroradiology, vol. 8, No. 3, pp. 3–12 (1981).

Knudsen et al., "Blood–brain barrier permeability measurements by double–indicator method using intravenous injection," Am. J. Physiol. 266 (Heart Circ. Physiolo. 35) pp. H987–H999 (1994).

Laloe et al., AIP Conf. Proc. #131, Workshop on Polarized $^3$He Beams and Targets, Am. Inst. of Physics, NY, pp. 47–72 (1985).

Lassen, "Cerebral Transit of an Intravascular Tracer May Allow Measurement of Regional Blood Volume But Not Regional Blood Flow," 4 J. Cereb. Blood Flow and Metab., pp. 633–634 (1984).

Le Bihan, "Magnetic Resonance Imaging of Perfusion*," Mag. Reson. In Med., vol. 14, pp. 283–292 (1990).

Le Roux et al., "Gas Transport Properties of Surface Fluorinated Poly(vinyltrimethyl–silane) Filmes and Composite Membranes," J. Membrane Sci., vol. 90, pp. 55–68 (1994).

Li et al., "Long–range, collision–induced hyperpolarizabilities of atoms or centrosymmetric linear molecules: Theory and numerical results for pairs containing H or He," J. Chem. Phys., vol. 105, No. 24, pp. 10954–10968 (Dec. 22, 1996).

Lockhart et al., "Absence of Abundant Binding Sites for Anesthetics in Rabbit Brain: An In Vivo NMR Study," Anesthesiology, vol. 73, pp. 455–460 (1990).

Long et al., "High–Field Cross Polarization NMR from Laser–Polarized Xenon to a Polymer Surface," J. Am. Chem. Soc., vol. 115, pp. 8491–8492 (1993).

Luhmer et al., "Study of Xenon Binding in Cryptophane–A Using laser–Induced NMR Polarization Enhancement," J. Am. Chem. Soc., vol. 121, pp. 3502–3512 (1999).

Lunsford et al., "In Vivo Biological Effects of Stereotactic Radiosurgery: A Primate Model," Neurosurgery, vol. 27, No. 3, pp. 373–382 (Sep. 1990).

Mair et al., "Probing Porous Media with Gas Diffusion NMR," Phys. Rev. Ltrs., vol. 83, No. 16, pp. 3324–3327 (1999).

Mair et al., "Magnetic Resonance Imaging of Convection in Laser–Polarized Xenon," Phys. Rev. E, vol. 61, No. 3 (Mar. 2000).

Manabe et al., "0.1–T Human Fat/Water Separation by SIDAC," Mag. Reson. In Med., vol. 5, pp. 492–501 (1987).

Mansfeld et al., "The use of $^{129}$Xe NMR exchange spectroscopy for probing the microstructure of porous materials," Chem. Phys. Ltrs., vol. 213, No. 1, 2, pp. 153–157 (Oct. 1, 1993).

Martin, "The Pharmacokinetics of Hyperpolarized Xenon: Implications for Cerebral MRI," Jour. Magn. Reson. Imag., vol. 7, No. 5, pp. 848–854 (Sep.–Oct. 1997).

McKim et al., "Evidence of xenon transport through the gramicidin channel: a $^{129}$Xe–NMR study," Biochimica et Biophysica Acta 1193, pp. 186–198 (1994).

Middleton, "The Spin Structure of the Neutron Determined Using a Polarized $^3$He Target", Ph.D. Dissertation, Princeton University (Nov. 1994).

Miller et al., "Xenon NMR: Chemical shifts of a general anesthetic common solvents, proteins, and membranes", Proc. of the Nat. Acad. of Sci. (USA), vol. 78, No. 8, pp. 4946–4949 (Aug. 1981).

Miller, "$^{129}$Xe NMR in Polymers," Rubber Chem. and Tech., vol. 66, pp. 455–461 (1993).

Mohr et al., "Surface Fluorination of Composite Membranes. Part I. Transport Properties," J. Membrane Sci., vol. 55, pp. 131–148 (1991).

Moschos et al., "Communications Nuclear Magnetic Relaxation of Xenon–129 Dissolved in Organic Solvents," J. Mag. Reson., vol. 95, pp. 603–606 (1991).

Mugler, III et al. "Gradient–Echo MR Imaging," RSNA Categorical Course in Physics: The Basic Physics of MR Imaging, U. of VA Health Sci. Ctr., pp. 71–88 (1997).

Newbury et al., "Gaseous $^3$He–$^3$He Magnetic Dipolar Spin Relaxation," Phys. Rev. A, vol. 48, No. 6, pp. 4411–4420 (1993).

Ottinger et al., "Broadening of the Rb Resonance Lines by the Noble Gases," Phys. Rev. A, vol. 11, pp. 1815–1828 (1975).

Pasquier et al., "$^{129}$Xe NMR as a Probe of the Dynamics of Gas Confined in Porous Vycor," Mag. Reson. Imag., vol. 14, No. 7/8, pp. 971–973 (1996).

Pauly, "Permeability and Diffusion Data," The Polymer Handbook, VI, pp. 435–449.

Peled et al., "Determinants of Tissue Delivery for $^{129}$Xe Magentic Resonance in Humans," Mag. Res. Med, vol. 36, pp. 340–343 (1996).

Pfeffer et al., "$^{129}$Xe Gas NMR Spectroscopy and Imaging with a Whole–Body Imager," J. Mag. Reson. Series A 108, pp. 106–109 (1994).

Pietraβ et al., "Optically Polarized 129Xe in NMR Spectroscopy," Advanced Materials, pp. 826–838 (1995).

Pollack et al., "Solubility of xenon in liquid n–alkanes. Temperature dependence and thermodynamic functions," J. Chem. Phys., vol. 7, No. 6, pp. 3221–3229 (Sep. 15, 1982).

Pollack et al., "Solubility of xenon in liquid n–alkanois: Thermodynamic functions in simple polar liquids," J. Chem. Phys., 81 (7) pp. 3239–3246 (Oct. 1, 1984).

Raftery, et al. , "High–Field NMR of Adsorbed Xenon Polarized by Laser Pumping," Phys. Rev. Lett., vol. 66, No. 5, pp. 584–587 (Feb. 4, 1991).

Raftery, et al., "NMR of optically pumped xenon thin films," Chem. Phys. Lett., vol. 191, No. 5, pp. 385–390 (Apr. 8, 1992).

Rinck et al., "NMR–Imaging of Fluorine–Containing Substances. $^{19}$Fluorine Ventilation and Perfusion Studies," vol. 140, No. 3, pp. 239–243 (Mar. 1984) (German).

Robillard, Jr. et al., "Aromatic Hydrophobes and β–Lactoglobulin A. Thermodynamics of Binding," Biochemistry, vol. 11, No. 21, pp. 3835–3840 (1972).

Ruth et al., "Production of Nitrogen–Free, Hyperpolarized $^{129}$Xe Gas," Appl. Phys. B, vol. 68, pp. 93–97 (1999).

Sauer et al., "Laser–Polarized Liquid Xenon," Chem. Phys. Lett., vol. 277, pp. 153–158 (Oct. 3 1997).

Schaefer et al., "Frequency shifts of the magnetic–resonance spectrum of mixtures of nuclear spin–polarized noble gases and vapors of spin–polarized alkali–metal atoms," Phys. Rev. A., vol. 39, No. 11, pp. 5613–5623 (1989).

Schaefer et al., "Determination of spin–exchange parameters between optically pumped rubidium and $^{83}$Kr," Phys. Rev. A., vol. 41, No. 11, pp. 6063–6070 (1990).

Schearer, "Optical Pumping of Neon ($^3P_2$) Metastable Atoms," Phys. Rev., vol. 180, No. 1, pp. 83–90 (1969).

Schearer, "Optical Pumping of Neon Metastable ($^3P_2$) Atoms," Phys. Rev. Lett., vol. 21, No. 10, pp. 660–661 (Sep. 2, 1968).

Schearer, "Optical Pumping of $^3P_2$ Argon and Xeon Atoms," Phys. Lett., vol. 28A, No. 9, pp. 660–661 (Feb. 10, 1969).

Schearer, "Depolarization Cross Sections for the Metastable Noble Gases by Optical Pumping," Phys. Rev., vol. 188, No. 1, pp. 505–506 (Dec. 5, 1969).

Schmidt et al., "Diffusion Imaging with Hyperpolarized $^3$He Gas," J. Mag. Reson., vol. 129, pp. 184–187 (1997).

Schoenborn, "Binding of Xenon to Horse Haemoglobin," Nature, vol. 208, pp. 760–762 (Nov. 20, 1965).

Shang–Yi, "Broadening, Asymmetry and Shift of Rubidium Resonance Lines Under Different Pressures of Helium and Argon up to 100 Atmospheres," Phys. Rev., vol. 58, pp. 1051–1058 (1940).

Simonsen et al., "CBF and CBV Measurements by USPIO Bolus Tracking: Reproducibility and Comparison with Gd–Based Values," J. Mag. Reson. Imag., vol. 9, pp. 342–347 (1999).

Sled et al., "Standing–Wave and RF Penetration Artifacts Caused by Elliptic Geometry: An Electrodynamic Analysis of MRI," IEEE Transactions on Medical Imaging, vol. 17, No. 4, pp. 653–662 (Aug. 1998).

Song et al., "Spin–Polarized $^{129}$Xe Gas Imaging of Materials," J. Mag. Reson., Series A 115, pp. 127–130 (1995).

Surkau et al., "Large hyperpolarized $^3$He quantities for $^3$He–MRI of the lung," Proceedings of the Int'l Soc. for Mag. Res. In Med., 5th Sci. Mtg. and Exh, Vancouver, BC, Canada (Apr. 12–18, 1997).

Susskind et al., "Studies of Whole–Body Retention and Clearance of Inhaled Noble Gases," Prog. Nucl. Med., vol. 5, pp. 13–34 (1978).

Swanson et al., "Brain MRI with Laser–Polarized $^{129}$Xe," Mag. Res. Med., vol. 38, pp. 695–698 (1997).

Tilton, Jr., et al, "Nuclear Magnetic Resonance Studies of Xenon–129 with Myoglobin and Hemoglobin," Biochemistry, vol. 21, No. 26, pp. 6850–6857 (1982).

Tongier et al., "Use of Cuffed Oropharyngeal Airway (COPA) as an Alternative to the LMA for Providing Positive Pressure Ventilation during Ambulatory Anesthesia," Anesthesiology, vol. 89, No. 3A (Sep. 1996).

Tseng et al., "NMR of Laser–Polarized $^{129}$Xe in Blood Foam," J. Mag. Res., vol. 126, pp. 79–86 (1997).

Wilcock, R.J. et al., "Solubilities of gases in liquids II. The solubilities of He, Ne, Ar, Kr, O2, $N_2$, CO, $CO_2$, $CH_4$, $CF_4$, and SF6 in n–octane 1–octanol, n–decane, and 1–decanol," J. Chem. Thermodyn., vol. 10, pp. 817–822 (1978).

Wilms et al., "Polarimetry on dense samples of spin–polarized $^3$He by magnetostatic detection," Nuc. Instru. & Methods in Phys. Res. A, vol. 401, pp. 491–498 (1997).

Wu et al., "Experimental Studies of Wall Interactions of Adsorbed Spin–Polarized $^{131}$Xe Nuclei," Phys. Rev. A, vol. 42, No. 5, pp. 2774–2784 (Sep. 1, 1990).

Wyrwicz, A.M. et al., "Multiple environments of fluorinated anesthetics in intact tissues observed with $^{19}$F NMR spectroscopy," FEBS Lett., vol. 162, No. 2, pp. 334–338 (Oct. 1983).

Wyrwicz, A.M. et al., "Noninvasive Observations of Fluorinated Anesthetics in Rabbit Brain by Fluorine–19 Magnetic Resonance," Science, vol. 222, pp. 428–430 (1983).

Yonas, H. et al., "Determination of Irreversible Ischemia by Xenon–Enhanced Computed Tomographic Monitoring of Cerebral Blood flow in Patients with Symptomatic Vasospasm," Neurosurgery, vol. 24, pp. 368–372 (Mar. 1989).

Yonehara et al., "Design of Rb Cell for Polarized $^3$He Ion Source Based on Electron Pumping," The 11th Symp. on Accelerator Sci. & Tech., Harima Sci. Garden City, pp. 174–175 (1998).

Zeng et al., "Experimental determination of the rate constants for spin exchange between optically pumped K, Rb, and Cs atoms and $^{129}$Xe nuclei in alkali–metal—noble–gas van der Waals molecules," Physical Review A, vol. 31, No. 1, pp. 260–278 (Jan. 1985).

Zhao et al., "Biomedical Imaging Using Hyperpolarized Noble Gas MRI: Pulse Sequence Considerations," Nucl. Instr. and Meth. in Phys. Res. A, vol. 402, pp. 454–460 (1998).

* cited by examiner

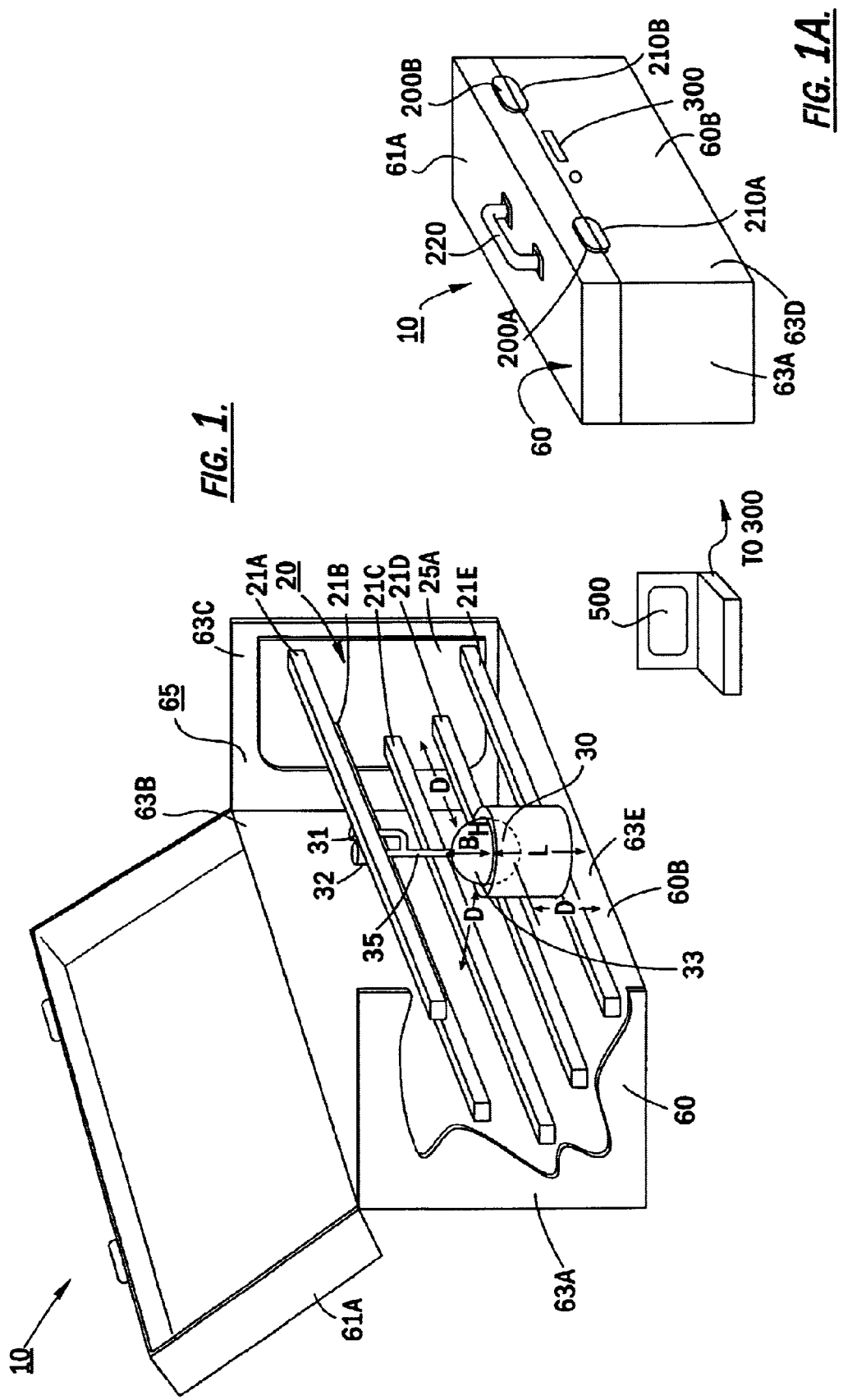

HYPERPOLARIZED GAS TRANSPORT AND STORAGE DEVICES AND ASSOCIATED TRANSPORT AND STORAGE METHODS USING PERMANENT MAGNETS

RELATED APPLICATIONS

This application claims the benefit of priority from Provisional Application Serial No. 60/148,359 filed on Aug. 11, 1999, entitled "Hyperpolarized Gas Transport and Storage Devices and Associated Transport and Storage Methods Using Permanent Magnets."

This invention was made with Government support under National Institute of Health Grant number R43HL62756-01. The United States Government has certain rights in this invention.

FIELD OF THE INVENTION

The present invention relates generally to the transport of hyperpolarized gases from one site to another, such as from a production site to a clinical use site. The hyperpolarized gases are particularly suitable for MR imaging and spectroscopy applications.

BACKGROUND OF THE INVENTION

Inert gas imaging ("IGI") using hyperpolarized noble gases is a promising recent advance in Magnetic Resonance Imaging (MRI) and MR spectroscopy technologies. Conventionally, MRI has been used to produce images by exciting the nuclei of hydrogen molecules (present in water protons) in the human body. However, it has recently been discovered that polarized noble gases can produce improved images of certain areas and regions of the body which have heretofore produced less than satisfactory images in this modality. Polarized Helium-3 ("$^3$He") and Xenon-129 ("$^{129}$Xe") have been found to be particularly suited for this purpose. Unfortunately, as will be discussed further below, the polarized state of the gases is sensitive to handling and environmental conditions and can, undesirably, decay from the polarized state relatively quickly.

Various methods may be used to artificially enhance the polarization of certain noble gas nuclei (such as $^{129}$Xe or $^3$He) over the natural or equilibrium levels, i.e., the Boltzmann polarization. Such an increase is desirable because it enhances and increases the MRI signal intensity, allowing physicians to obtain better images of the substances in the body. See U.S. Pat. No. 5,545,396 to Albert et al., the disclosure of which is hereby incorporated by reference as if recited in full herein.

A "$T_1$" decay time constant associated with the hyperpolarized gas' longitudinal relaxation is often used to characterize the length of time it takes a gas sample to depolarize in a given situation. The handling of the hyperpolarized gas is critical because of the sensitivity of the hyperpolarized state to environmental and handling factors and thus the potential for undesirable decay of the gas from its hyperpolarized state prior to the planned end use, e.g., delivery to a patient for imaging. Processing, transporting, and storing the hyperpolarized gases—as well as delivering the gas to the patient or end user—can expose the hyperpolarized gases to various relaxation mechanisms such as magnetic field gradients, surface-induced relaxation, hyperpolarized gas atom interactions with other nuclei, paramagnetic impurities, and the like.

One way of reducing the surface-induced decay of the hyperpolarized state is presented in U.S. Pat. No. 5,612,103 to Driehuys et al. entitled "Coatings for Production of Hyperpolarized Noble Gases." Generally stated, this patent describes the use of a modified polymer as a surface coating on physical systems (such as a Pyrex™ container) which contact the hyperpolarized gas to inhibit the decaying effect of the surface of the collection chamber or storage unit. Other methods for reducing surface-induced decay are described in co-pending and co-assigned U.S. Patent application Ser. No. 09/163,721 to Zollinger et al., entitled "Hyperpolarized Noble Gas Extraction Methods, Masking Methods, and Associated Transport Containers." However, other relaxation mechanisms arise during production, handling, storage, and transport of the hyperpolarized gas. These problems can be particularly troublesome when storing the gases or transporting the hyperpolarized gas from a production site to a (remote) distribution and/or use site. In transit, the hyperpolarized gas can be exposed to many potentially depolarizing influences. There is, therefore, a need to provide improved ways to transport hyperpolarized gases so that the hyperpolarized gas is not unduly exposed to depolarizing effects during transport. Improved storage and transport methods and systems are desired so that the hyperpolarized product can retain sufficient polarization to allow effective imaging at delivery when stored or transported over longer transport distances in various (potentially depolarizing) environmental conditions, and for longer time periods from the initial point of polarization than has been viable previously.

One design used to provide a homogeneous field in a unit for transporting and storing hyperpolarized gas products is proposed by Hasson et al. in U.S. patent application Ser. No. 09/333,571 entitled "Hyperpolarized Gas Containers, Solenoids, Transport and Storage Devices and Associated Transport and Storage Methods." This technique comprises a durable, safe, and convenient transport unit. However, a magnetic field generator within the transport unit used for generating the hyperpolarized gas magnetic holding field requires power to operate it. During transport or in storage, a convenient source of power may be difficult to find. Additionally, batteries with lengthy lifetimes suitable for hyperpolarized gas transport and storage can be heavy and are often large.

Another alternative is proposed by Aidam et al. in WO 99/17304. This reference proposes configuring a magnetically shielded container using opposing pole shoes to provide a unit for holding and transporting a chamber of polarized gas. Unfortunately, the shielded container is designed so as to require removal of one of the pole shoes to remove the gas chamber, thereby potentially sacrificing the homogeneity of the field. Additionally, the pole shoes can be dented or permanently magnetized during transport and storage. Physical deformation of the pole shoes which occurs during transport or normal use can unfortunately permanently destroy the homogeneity of the magnetic field. Furthermore, the pole shoes (which as described by Aidam et al. comprise mu metal or soft iron) can display hysteresis characteristics. This hysteresis can cause the pole shoes to be permanently magnetized if placed next to a magnetic field source, thereby acting as its own magnet and potentially deleteriously affecting the homogeneity of the resulting permanent magnet field.

A third alternative is proposed in U.S. patent application Ser. Nos. 08/989,604 and 09/210,020 to Driehuys et al. In these two patent applications, a magnetic field generator is described for the transport of hyperpolarized frozen xenon. The embodiment proposed by Driehuys et al. comprises a relatively small magnet yoke and two permanent magnets mounted opposite one another on the magnet yoke. This configuration produces a magnetic field with high field strength but relatively low homogeneity. While high magnetic field strength alone can generally maintain a highly hyperpolarized state in a solid hyperpolarized gas product, thawing prior to use produces a gaseous xenon product, which then typically requires that the field be homogeneous to reduce the likelihood of rapid depolarization due to gradient-induced relaxation.

OBJECTS AND SUMMARY OF THE INVENTION

It is therefore an object of the present invention to provide a transport unit which can hold quantities of hyperpolarized gas for extended periods of time, such that the hyperpolarized gas is sufficiently viable to produce clinically useful images at a spatially and/or temporally separated point in time from the point of polarization.

It is also an object of the present invention to configure a transport unit such that it can be used to transport gas in a commercial shipping vehicle and/or store gas over relatively long periods of time (the latter particularly for when the polarized gas is not intended to be remotely shipped).

Another object of the present invention is to shield a quantity of hyperpolarized gas from deleterious environmentally-induced depolarizing events during transport and/or storage.

An additional object of the present invention is to configure a transport unit with permanent magnets which does not require disassembly to dispense the hyperpolarized gas therefrom or to insert hyperpolarized gas in containers therein.

It is also an object of the present invention to create a transport unit which is lightweight, compact, and easily transportable to facilitate ease of transport and storage.

An additional object of the present invention is to provide a magnetic field generator or source which does not require external power.

It is another object of the present invention to configure a transport unit to reduce the external force associated with shock, vibration, and/or other mechanical collisions that are input into or transmitted to containers of hyperpolarized gas held within the transport unit.

It is also an object of the present invention to provide a portable unit for storing or transporting hyperpolarized gas held in a plurality of separate containers therein.

It is another object of the present invention to size and configure a transport unit to provide a suitable environment for storing and transporting large pressurized multi-bolus containers of hyperpolarized gas.

An additional object of the present invention is to configure a transport unit with an easily accessible means for interrogating the polarized state of the polarized gas held therein using nuclear magnetic resonance (NMR), in order to measure the polarization of the gas, or to measure the decay rate of the polarization.

An additional object of the present invention is to reduce hyperpolarization relaxation due to gas-gas relaxation and/or gradient relaxation by diluting the hyperpolarized gas with a buffer gas.

These and other objects are satisfied by the present invention by configuring a transport unit with a series of relatively lightweight permanent magnets arranged to provide a region of homogeneity for a quantity of hyperpolarized gas held therein. In particular, a first aspect of the present invention is directed to a transport unit which includes a housing and at least four discrete spaced-apart permanent magnets which are configured such that they are arranged in spaced-apart relationship about a longitudinally extending axis defining a center therebetween. The permanent magnets provide a magnetic field with a region of homogeneity substantially centered with respect to the longitudinal axis and the magnets are oriented such that the field direction they produce are substantially perpendicular to the longitudinal axis. Additionally, the transport unit includes at least one container, sized and configured to hold a quantity of hyperpolarized gas, positioned proximate to the region of homogeneity.

In one preferred embodiment, the spaced-apart permanent magnets are elongated and positioned in spaced-apart circumferential relationship to longitudinally extend a distance sufficient to define a substantially cylindrical volume projected in space. In another preferred embodiment, the spaced-apart permanent magnets are positioned in spaced-apart circumferential relationships to define a spherical volume projected in space.

Another aspect of the present invention is directed toward a transport unit for transporting containers of hyperpolarized gas products. This transport unit includes first and second spaced-apart opposing end plates and a plurality of spaced-apart elongated permanent magnets having opposing first and second ends. Each of the permanent magnets are positioned to extend substantially linearly between the first and second opposing end plates to provide a magnetic field with a region of homogeneity therebetween. Additionally, a chamber (configured to hold a quantity of hyperpolarized gas) is preferably positioned between the first and second end plates within the region of homogeneity.

Preferably, the spaced-apart elongated permanent magnets are positioned in a spaced-apart circumferential relationship to define a cylinder projected in space. In one preferred embodiment, the plurality of permanent magnets are rubber strip magnets and each magnet is structurally secured to a longitudinally extending support member which is attached to each of the opposing end plates. Preferably, the magnets are configured to remain fixedly attached to the end plates via the support members during installation and removal of the gas container(s) into and out of the transport unit. It is also preferred that the permanent magnets be substantially circumferentially spaced apart about a circle with a center coincident with a longitudinal center axis extending therethrough. The center of the longitudinal center axis defines the center of a holding volume in the transport unit, and a vertical diametrical line drawn through the center of the circle between the upper and lower parts thereof defines a first vertical axis. In this preferred embodiment, the elongated magnets are oriented such that the magnetic north pole surface is in a fixed angular relationship with the first vertical axis. Additionally, a plurality of supplementary magnets can be positioned on end portions of selected elongated magnets enlarge the region of homogeneity therein.

Another aspect of the present invention is directed toward a transport unit for transporting hyperpolarized gas using discrete magnets. The unit includes at least one gas chamber configured to hold a quantity of hyperpolarized gas therein, a first upstanding end wall comprising a first set of spaced-apart discrete permanent magnets positioned thereon, and a second upstanding end wall positioned in the transport unit spaced apart from and opposing the first wall to define a gas enclosure volume for holding the gas chamber therebetween. The second upstanding wall comprises a second set of spaced-apart discrete permanent magnets positioned thereon. Additionally, the first and second magnet sets are circumferentially arranged about two corresponding circles with corresponding first diameters and aligned centers on the first and second walls, respectively, and each of the discrete permanent magnets has a magnetic north and south pole associated therewith. Furthermore, the first magnet set is arranged on the first wall such that the magnetic north pole of each magnet in the first magnet set is directed toward the center of the circle that the first magnet set is arrange thereabout, and the magnetic south pole of each magnet in the second magnet set is directed toward the center of the circle around which the second magnet set is arranged. Each of the permanent magnets in each of the first and second magnet sets are arranged to laterally extend toward the other a minor distance to define a central free space with a magnetic holding field having a region of homogeneity therebetween.

Preferably, the transport unit also includes a housing, where the housing is spaced apart a predetermined separation distance (preferably at least about 2 inches) from the perimeter of the gas chamber holding a major volume of the hyperpolarized gas therein. The transport unit also preferably includes a third supplementary set of magnets arranged to be circumferentially spaced apart about a third circle having a second diameter, wherein the set of supplementary magnets is positioned intermediate the first and second magnet sets. Preferably, the second diameter is larger than the first diameter. The magnets in the supplementary set of magnets have a north pole and a south pole, and the north pole of the supplementary magnets are oriented to point normal to the plane defined by the third circle and in the direction of a plane defined by the first circle.

Another aspect of the present invention is directed toward a method of fabricating a cylindrically shaped magnetic field volume. This method involves rolling a flexible magnetic sheet into a first hollow cylinder such that the ends abut. Then, a magnetic field is applied to the cylindrically configured flexible magnetic sheet which is then unrolled. Finally, the flexible magnetic sheet is rerolled into a second hollow cylinder such that the ends abut, and such that the sides are reversed, i.e., the side that was inside the first hollow cylinder is positioned to define the outer side of the second hollow cylinder.

An additional aspect of the present invention is directed toward a transport unit for transporting a quantity of hyperpolarized gas using a magnetic hollow cylinder to generate a holding field for a chamber of hyperpolarized gas. The transport unit includes at least one container for holding hyperpolarized gas, a flexible material layer having an applied magnetization, wherein the flexible layer is configured as a cylinder having magnetic north and south poles and a magnetic field strength. The flexible material layer defines a homogenous magnetic holding field for the container and fits inside a housing.

Preferably, the housing is configured and sized to be at least 2 inches away from the walls of the gas container. Furthermore, the flexible material is magnetized such that the direction of the magnetic north varies about the circumference of the cylinder. The cylinder also includes a continuous surface represented by a plurality of adjacent points drawn in space. At each point on the flexible cylinder, there is a direction of magnetic north and a first vertical axis which intersects the point. Additionally, each point has a second vertical axis associated with it which diametrically extends to bisect opposing top and bottom surfaces of the cylinder. The flexible cylinder is preferably configured such that at any point, a first angle between the magnetic north direction and the first vertical axis is twice the magnitude of a second angle between the second vertical axis and a line to the point from the center of the second diametrical axis.

The present invention is advantageous because it enables hyperpolarized gas to withstand travel from a production site to a remote use site in a hyperpolarized state which is still capable of producing clinically useful images at the remote site. To do this, the present invention shields the gas from deleterious ambient external magnetic fields while creating its own internal holding field for the hyperpolarized gas without requiring an external or internal power source. Advantageously, this holding field comprises permanent magnets, which are lightweight and easy to manufacture. Additionally, the magnetic holding field does not need to be disturbed to insert or remove a gas chamber, which advantageously allows the magnetic holding field to carry several gas chambers at one time without deleterious affects on the remaining chambers in the holding field when one is removed therefrom.

BRIEF DESCRIPTION OF THE DRAWINGS

FIG. 1 is a partial cutaway perspective view of a transport unit according to the present invention. As shown, FIG. 1 illustrates the transport unit with a valved gas chamber and a permanent strip magnet arrangement according to one embodiment of the present invention.

FIG. 1A is a perspective view of the transport unit shown in FIG. 1 which illustrates the transport unit in a closed position (enclosing the gas chamber within) according to the present invention.

DETAILED DESCRIPTION OF THE PREFERRED EMBODIMENTS

Figure 1B:
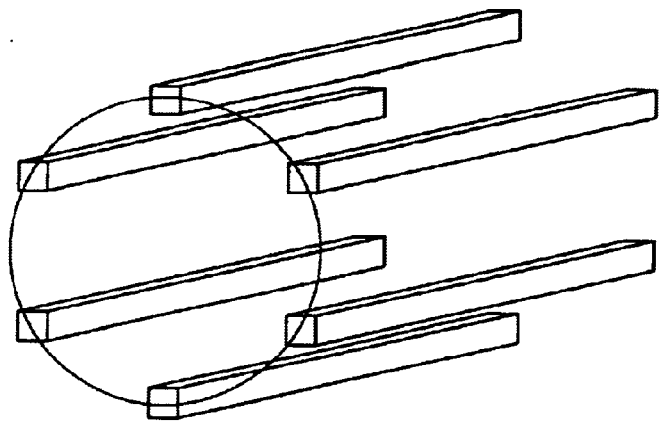
FIGS. 1B–1D are perspective views of alternative permanent magnet strip arrangements according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. In the figures, layers and regions may be exaggerated for clarity.

For ease of discussion, the term "hyperpolarized gas" will be used to describe a hyperpolarized gas alone, or a hyperpolarized gas that contacts or combines with one or more other components, whether gaseous, liquid, or solid. Thus, the hyperpolarized gas described herein can be a hyperpolarized gas composition/mixture (preferably non-toxic such that it is suitable for in vivo introduction) such that the hyperpolarized gas can be combined with other gases and/or other inert or active components. Also, as used herein, the term "hyperpolarized gas" can include a product in which the hyperpolarized gas is dissolved into or combined with another liquid or gas (such as a carrier fluid) or processed such that it transforms into a substantially liquid state, i.e., "a liquid polarized gas". Thus, although the term "hyperpolarized gas" includes the word "gas", this word is used to name and descriptively track the noble gas which is polarized via a hyperpolarizer to obtain a polarized "gas" product. In summary, as used herein, the term "gas" has been used in certain places to descriptively indicate a hyperpolarized gas which can include one or more components and which may be present in one or more physical forms.

Background—Hyperpolarization

Various techniques have been employed to polarize, accumulate and capture polarized gases. For example, U.S. Pat. No. 5,642,625 to Cates et al. describes a high volume hyperpolarizer for spin-polarized noble gas and U.S. Pat. No. 5,809,801 to Cates et al. describes a cryogenic accumulator for spin-polarized $^{129}$Xe. The disclosures of these patents are hereby incorporated herein by reference as if recited in full herein. As used herein, the terms "hyperpolarize" and "polarize" are used interchangeably and mean to artificially enhance the polarization of certain noble gas nuclei over the natural or equilibrium levels. Such an increase is desirable because it allows stronger imaging signals corresponding to better MRI images of the substance in a targeted area of the body. As is known by those of skill in the art, hyperpolarization can be induced by spin—exchange with an optically pumped alkali-metal vapor, or alternatively by metastability exchange. See U.S. Pat. No. 5,545,396 to Albert et al. The alkali metals capable of acting as spin exchange partners in optically pumped systems include any of the alkali metals. Preferred alkali metals for this hyperpolarization technique include Sodium-23, Potassium-39, Rubidium-85, Rubidium-87, and Cesium-133.

Alternatively, the noble gas may be hyperpolarized using metastability exchange. (See e.g., Schearer, L. D., *Phys Rev*, 180:83 (1969); Laloe, F., Nacher, P. J., Leduc, M., and Schearer L. D., AIP ConfProx #131 (Workshop on Polarized $^3$He Beams and Targets) (1984)). The technique of metastability exchange involves direct optical pumping of, for example, $^3$He without the need for an alkali metal intermediary. Since this process works best at low pressures (0–10 Torr), a compressor is typically used to compress the $^3$He after the hyperpolarization step.

Regardless of the hyperpolarization method used, once the active mechanism is no longer in effect, the polarization of the gas will inevitably decay toward its thermal equilibrium value, which is essentially zero. The present invention is configured to work with any hyperpolarization technique and is not limited to working with any one machine, method, or particular gas.

Polarized Gas Relaxation Processes

Under most circumstances, the non-equilibrium polarization "P(t)" of a gas decays according to $$dP(t)/dt = -P(t)/T_1 \qquad 1.0$$

The overall decay rate ($1/T_1$) can be expressed as the sum of rates from various mechanisms:

$$1/T_1 = (1/T_1)_{Gas} + (1/T_1)_{Surface} + (1/T_1)_{EMF} + (1/T_1)_{Gradient} \qquad 2.0$$

Gas Interaction Relaxation

The first decay term "$(1/T_1)_{Gas}$" represents the depolarization of the noble gas nuclei when interacting with each other and can also include interaction of the atoms with gaseous impurities such as oxygen. Thus, careful preparation of gas containment, transfer, and extraction systems is important for providing good polarization lifetimes as will be discussed further hereinbelow. Examples of suitable gas extraction methods and apparatus are described in co-pending and co-assigned U.S. patent application Ser. No. 09/163,721, entitled "Hyperpolarized Noble Gas Extraction Methods, Masking Methods, and Associated Transport Containers," the disclosure of which is hereby incorporated by reference as if recited in full herein.

Even in the absence of all other relaxation mechanisms, collisions between identical polarized gas atoms impose a fundamental upper limit to the achievable $T_1$ lifetime. For example, $^3$He atoms relax through a dipole-dipole interaction during $^3$He—$^3$He collisions, while $^{129}$Xe atoms relax through N.I spin rotation interaction (where N is the molecular angular momentum and I designates nuclear spin rotation) during $^{129}$Xe-$^{129}$Xe collisions. In any event, because both processes occur during noble gas-noble gas collisions, both resulting relaxation rates are directly proportional to number density ($T_1$ is inversely proportional to number density). At one bar pressure, the theoretical maximum relaxation time $T_1$ of $^3$He is about 750 hours, and for $^{129}$Xe the corresponding relaxation time is about 56 hours. See Newbury et al., *Gaseous 3He-3He Magnetic Dipolar Spin Relaxation*, 48 Phys. Rev. A., No. 6, p. 4411 (1993); Hunt et al., *Nuclear Magnetic Resonance of $^{129}$Xe in Natural Xenon*, 130 Phys Rev. p. 2302 (1963).

However, relatively small amounts of hyperpolarized gas diluted with buffer gases of low magnetic moment (such as nitrogen or argon) can significantly increase the $T_1$ of the mixture (compared to the $T_1$ of the pure hyperpolarized gas at the same pressure) despite high pressures. This is because the buffer gas has a low magnetic moment and therefore does not substantially contribute to gas-gas relaxation mechanisms. The buffer gas additionally acts to decrease the interaction of potentially depolarizing hyperpolarized gas nuclei by decreasing the concentration of (diluting) the hyperpolarized gas. Furthermore, as described below, packaging small quantities of hyperpolarized gas with buffer gas(es) at high total pressures (due to buffer gas dilution) can additionally decrease the diffusion of the hyperpolarized gas atoms, thereby decreasing the effects of magnetic gradient relaxation due to magnetic field inhomogeneities.

Unfortunately, other relaxation processes such as surface relaxation, electromagnetic interference (EMI), and magnetic gradient relaxation can also prevent the realization of the theoretical relaxation times. Accordingly, each of these mechanisms are of concern when handling hyperpolarized gases and each is preferably addressed so as to extend the overall relaxation time to allow for consistently longer storage or transit times for successful transport and commercialization of hyperpolarized gases.

Surface-induced Relaxation

The $(1/T_1)_{Surface}$ term in equation 2.0 represents the surface-induced relaxation mechanism. For example, the collisions of gaseous $^{129}$Xe and $^3$He with container walls ("surface relaxation") historically have been thought to dominate most relaxation processes. For $^3$He, most of the known longer relaxation times have been achieved in special glass containers having a low permeability to helium and low iron content. See e.g. Fitzsimmons et al., *Nature of surface induced spin relaxation of gaseous He-3*, 179 Phys. Rev., No. 1, p. 156 (1969). U.S. Pat. No. 5,612,103 to Driehuys et al. describes using coatings to inhibit the surface-induced nuclear spin relaxation of hyperpolarized noble gases, especially $^{129}$Xe. The contents of this patent are hereby incorporated by reference as if recited in full herein. Similarly, co-pending and co-assigned U.S. patent application Ser. No. 09/126,448 to Deaton et al. and its related U.S. patent application Ser. No. 09/334,400 by Zollinger et al. describe preferred gas-contact surface materials and associated thicknesses, o-ring, valve or seal materials and/or coatings which are friendly to the polarized state of the gas, i.e., which can inhibit surface/contact-induced relaxation mechanisms. The contents of these applications are also hereby incorporated by reference as if recited in full herein.

Electromagnetic Interference

The relaxation mechanism expressed by the term $(1/T_1)_{EMI}$ is the relaxation induced by time-dependent electromagnetic fields. Indeed, EMI can potentially destroy the hyperpolarized state of the gas (EMI is particularly problematic if coherent at the magnetic resonance frequency). Unfortunately, EMI can be generated by relatively common sources. For example, EMI is typically generated from a vehicle's engine, high voltage lines, power stations and other current carrying entities. As such, transport away from the hyperpolarized gas production site can expose the hyperpolarized gas to these undesirable relaxation sources that, in turn, can dramatically reduce the polarization lifetime of the transported gas.

Fluctuating fields are particularly deleterious if they are coherent at the magnetic resonance frequency. For example, assuming a severe scenario of a highly coherent oscillating field, the relaxation rate can be comparable to the Rabi frequency:

$$(1/T_1)_{EMI} \approx \gamma H_{AC}/2 \qquad 2.1$$

Here, "$\gamma$" is the gyromagnetic ratio of the spins, and "$H_{AC}$" is the magnitude of the transverse fluctuating field. A resonant field $H_{AC}$ of only 1 $\mu$G can cause relaxation on a time scale of order 100 seconds for $^3$He. On the other hand, if the field is randomly fluctuating, the relaxation rate is given by $$(1/T_1)_{EMI} = \gamma^2 \langle H_{AC}^2 \rangle \tau_c/(1+\omega^2\tau_c^2) \qquad 2.2$$

where "$\tau_c$" is the autocorrelation time of the fluctuations, "$\omega$" is the Larmor frequency of the spins, and "$\langle H_{AC}^2 \rangle$" is the mean value of the square of the fluctuating transverse field component. In the random fluctuation case, the rate can be suppressed by increasing $\omega$ (which is proportional to the holding field strength), particularly if $\omega\tau>1$. In either case, the relaxation rate can be suppressed by reducing the magnitude of the interference $H_{AC}$.

Magnetic Field Gradients

Magnetic gradient relaxation expressed by the term $(1/T_1)_{Gradient}$ is associated with the relaxation attributed to the exposure of the hyperpolarized noble gases to inhomogeneous static magnetic fields. Generally stated, as the polarized gas atoms diffuse or move through an inhomogeneous magnetic field, they experience a time-dependent field, which can depolarize the hyperpolarized atoms. For example, at typical pressures (i.e., about 1 bar), the relaxation rate attributed to a static magnetic field gradient can be expressed by the following equation:

$$(1/T_1)_{Gradient} = D(|\nabla B_x|^2 + |\nabla B_y|^2)/B_z^2 \qquad 2.3$$

where "$B_z$" is the primary component of the static magnetic field, "$\nabla B_x$" and "$\nabla B_y$" represent the gradients of the transverse field components, and "D" is the diffusion coefficient of the polarized atoms through the gas. For example, for pure $^3$He at 1 bar of pressure, the diffusion coefficient $D \approx 1.9$ cm$^2$/s. In the earth's magnetic field (a static magnetic field of about 0.5 G), a 5 mG/cm transverse field gradient can cause a relaxation rate $(1/T_1)_{Gradient}$ of about $1.9 \times 10^{-4}$ s$^{-1}$ (i.e., a $T_1$ of about 1.5 hours). In contrast, in a 5 Gauss field (as opposed to a 0.5 Gauss field), the same 5 mG/cm gradient will typically yield a $T_1$ of about 150 hours. Thus a magnetic field homogeneity on the order of $10^{-3}$ cm$^{-1}$ is desirable to make gradient relaxation tolerable at these pressures. Alternatively, higher gradients are acceptable if the $^3$He is pressurized to at least several bars of pressure, or alternatively mixed with another gas such as nitrogen or argon to restrict diffusion, i.e., lower the diffusion coefficient. As will be appreciated by those of skill in the art, during transport, it is desirable to avoid inhomogeneous magnetic fields, e.g., to avoid nearby ferromagnetic objects. For example, it is desired to maximize, to the extent possible, the spatial distance between the hyperpolarized gas and objects that can produce strong magnetic fields and/or magnetic field gradients.

Shielding

The present invention recognizes that unless special precautions are taken, relaxation due to external magnetic fields (static and/or time dependent) can dominate all other relaxation mechanisms. As discussed above, both gradients in the static field and (low frequency) oscillating magnetic fields experienced by the hyperpolarized gas can cause significant relaxation.

Advantageously, the instant invention employs an (externally) applied static magnetic holding field to substantially protect the hyperpolarized gas from depolarizing effects attributed to one or more of the EMI and field gradients during transport. The instant invention employs a magnetic holding field which raises the Larmor frequency of the hyperpolarized gas above the region of noise (1/f), i.e., the region where the intensity of ambient electromagnetic noise is typically high (this noise is typically under about 5 kHz). Further, the magnetic holding field of the instant invention is also preferably selected such that it raises the frequency of the hyperpolarized gas to a level which is above those frequencies associated with large acoustic vibrations (these acoustic vibrations are typically less than about 20 kHz). As will be discussed below, the increased frequency associated with the applied magnetic holding field advantageously allows a transport unit to have greater electromagnetic shielding effectiveness for a given housing thickness (the housing used to hold the hyperpolarized gas therein during transport). The skin depth "δ" of a conductive shielding material is inversely proportional to the square root of the frequency. Thus, at 25 kHz, an exemplary preferred skin depth for aluminum is about 0.5 mm, as compared to about 2.0 mm at 1.6 kHz.

Preferably, the magnetic holding field of the instant invention is selected so that any external field-related fluctuations are small in magnitude compared to the field strength of the holding field; in this way the holding field can minimize the hyperpolarized gas's response to unpredictable external static field gradient-induced relaxation. This can be accomplished by applying to the hyperpolarized gas a proximately positioned magnetic holding field which is sufficiently strong and homogeneous so that it minimizes the unpredictable externally-applied static field-related relaxation during transport. A sufficiently homogeneous holding field preferably includes (but is not limited to) a magnetic holding field which has a homogeneity on the order of about at least $10^{-3}$ cm$^{-1}$ over the central part of the holding field (i.e., the part of the field extending about a major volume of the hyperpolarized gas). In the previous example, if a homogeneous field of even 10 G were applied, the same 5 mG cm$^{-1}$ gradient would instead result in $T_1 \approx 600$ hr. More preferably, the magnetic holding field homogeneity is about at least $5 \times 10^{-4}$ cm$^{-1}$ over about a region in space which approximates a three-inch diameter sphere. Further, the transport unit 10 of the instant invention includes and provides a magnetic holding field which is positioned, sized, and configured relative to the hyperpolarized gas such that it also minimizes the EMI or oscillating magnetic field depolarization effects. The depolarizing effect of EMI is preferably (substantially) blocked by applying the magnetic holding field proximate to the gas so that the resonant frequency of the hyperpolarized gas is shifted to a predetermined frequency. Preferably, the predetermined frequency is selected such that it lies above or outside the bandwidth of prevalent time-dependent fields produced by electrically powered or supplied sources.

Alternatively, or additionally, the external interference can be shielded by positioning a substantially continuous metallic shield or shipping container having at least one layer formed of a conductive material such as metal around the container of hyperpolarized gas. The preferred shielding thickness is related to the spatial decay constant of an electromagnetic wave or skin depth "δ". The skin depth "δ" at an angular frequency "ω" is given by $\delta = c/(2\pi\mu\sigma\omega)^{1/2}$, where "$\mu$" is the magnetic permeability and "σ" is the electrical conductivity of the material. At preferred operating frequencies (about 24 kHz), the Larmor radiation wavelength is long (~10 km), and is much larger than the container size.

The shielding effectiveness is also dependent upon the container geometry as well as the shielding thickness. For a thin spherical conductor of radius "a" and thickness "t", the shielding factor "F" for wavelengths k>>a is given approximately by $$F = (1 + (2at/3\delta^2)^2)^{1/2} \qquad 2.4$$

Interestingly, the shielding effectiveness increases as the size (typically radius) of the shield is increased. It is therefore preferred that the shipping container or metallic housing used to shield or surround the hyperpolarized gas be configured to define an internal volume which is sufficient to provide increased shielding effectiveness. Stated differently, as shown in FIG. 1, it is preferred that the walls which define the housing 63A, 63B, 63C, and 63E are spaced apart a predetermined distance "D" relative to the position of the gas container 30. In one preferred embodiment, the distance "D" is at least 2 inches from the major volume of the gas chamber 33. More preferably, the distance "D" is at least 4 inches, and even more preferably, at least 7 inches. Preferably, the container 30 is positioned in the housing of the transport unit 10 that the linear distance "L" from the center of the major volume portion of the gas chamber 33 to the nearest wall of the housing divided by the radius of the chamber 33 defines a ratio L/R which is at least 2, more preferably at least 3, and most preferably at least 5.

Alternatively, or additionally, the transport unit can be configured with at least one layer formed from about 0.5 mm thick of magnetically permeable material, such as ultra low carbon steel, soft iron, or mu-metals (by virtue of their greater magnetic permeability). However, these materials may significantly influence the static magnetic field and, as will be appreciated by one of skill in the art, must be designed accordingly not to affect the homogeneity adversely.

Irrespective of the skin depth of the materials used to form the shipping container housing (types of materials and number of layers), application of a homogeneous magnetic holding field proximate to the hyperpolarized gas can help minimize the gas depolarization by virtue of decreasing the skin depth δ, which is inversely proportional to the square root of the frequency. Further, it helps by pushing the resonant frequency of the gas outside the bandwidth of common AC fields. It is preferred that the resonant frequency of the hyperpolarized gas be raised such that it is above about 10 kHz, and more preferably be raised such that it is between about 20–30 kHz. Stated differently, it is preferred that for shielding, the applied magnetic holding field has a field strength of about 2 to 35 Gauss. It is more preferred that for $^{129}$Xe, the magnetic holding field is preferably at least about 20 Gauss; and for $^3$He, the magnetic holding field is preferably at least about 7 Gauss.

Transport Unit

Figure 1C:
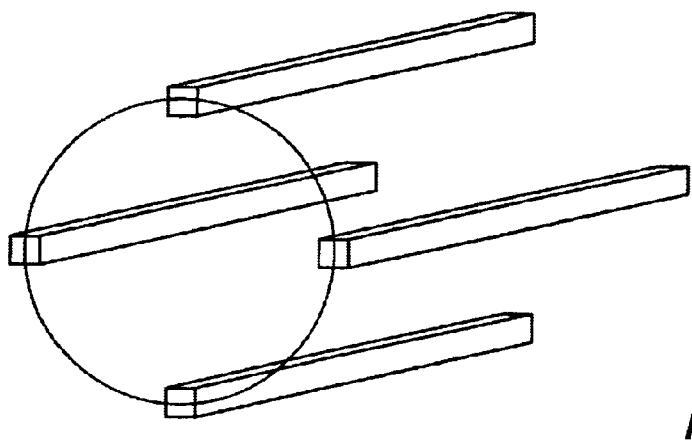
Figure 1D:
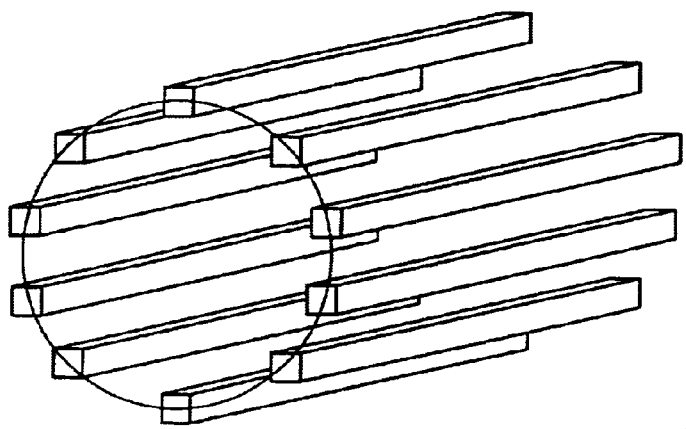
Figure 2:
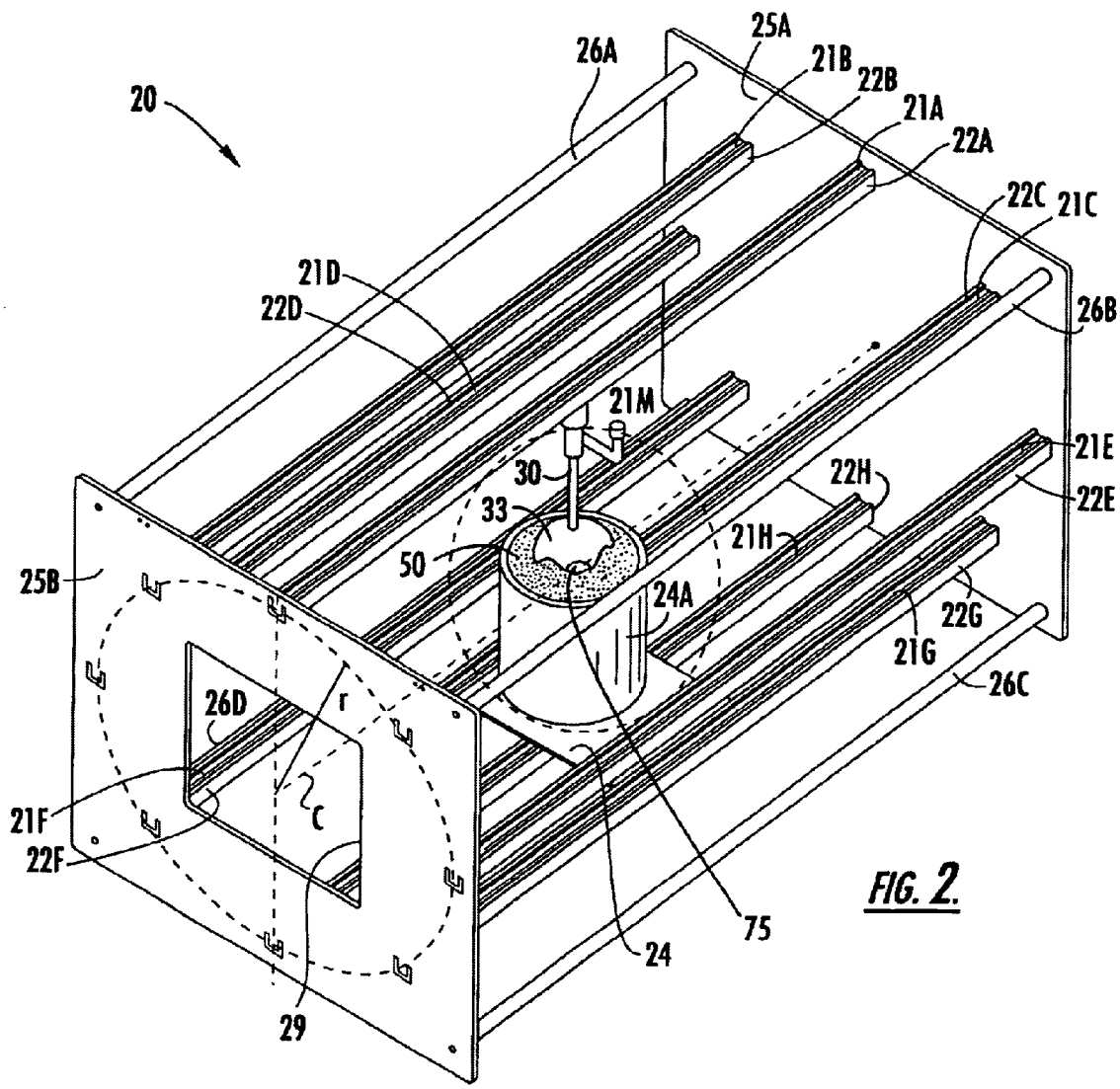
FIG. 2 is an enlarged cutaway perspective view of the permanent magnet assembly and gas chamber shown in FIG. 1.

Referring to FIG. 1, a transport unit 10 is illustrated according to a preferred embodiment of the instant invention. As shown, the transport unit 10 includes a gas storage chamber 30 and a magnetic field generator 20, which provides a magnetic holding field $B_H$ for the hyperpolarized gas. As shown in FIG. 2, the magnetic field generator 20 comprises a plurality of elongated permanent magnet strips 21A–21H and a support structure, including support elements 22A–22H, end plates 25A, 25B, and bars 26A–26D. The permanent magnet assembly 20 and transport unit 10 are configured and sized to receive at least one hyperpolarized gas storage chamber 30 therein. Preferably, the transport unit 10 and magnet strips 21A–21H are arranged such that the major volume of the chamber 33 is substantially within a region of homogeneity 21M (preferably about $10^{-3}$ cm$^{-1}$ or better) defined by the magnetic field $B_H$ generated by the permanent magnet assembly 20.

As shown in FIG. 1, the transport unit 10 preferably includes a substantially non-ferromagnetic metallic case or housing 60 having a predetermined skin depth appropriately sized to provide the desired shielding, and which includes a bottom portion 60B and a top 61A. As is also shown, the top 61A opens to facilitate easy access to the exit port 31 and valve 32 of the gas chamber 30. It is preferred that the transport unit 10 be configured with a minimal amount of ferromagnetic materials on or inside the transport unit 10 (i.e., is substantially free of ferromagnetic materials that are not intended to create the homogeneous holding field $B_H$). As used herein, the term "transport" is used to describe the unit, however, it will be appreciated by one of skill in the art that the instant invention may also be used to store a quantity of hyperpolarized gas product therein. As such, the term "transport unit" includes a unit that can be used as either a storage unit, a transport unit, or both a storage and transport unit.

As shown in FIG. 1, the top 61A of the housing is hinged to the bottom of the case 60B, which defines an enclosure volume 65. Preferably, as shown in FIG. 1, the enclosure volume 65 is defined by a contiguous arrangement of four upstanding sidewalls 63A–63D (63D shown in FIG. 1A) connected by a bottom wall 63E and a lid 61A. Thus, as shown in FIG. 1A, when the top 61A is closed, the housing 60 surrounds the gas chamber 30 and other internally mounted components (such as the permanent magnet assembly 20).

As shown in FIG. 1A, the top portion 61A preferably includes latches 200A, 200B which engage with corresponding components 210A, 210B positioned on the outside wall of the bottom portion of the case 60B to secure the top 61A to the bottom 60B when the top 61A is closed (i.e., preferably during transport and storage). Also preferably, the housing has at least one handle 220 to facilitate transportability. Preferably, the housing 60 and, indeed, the entire transport unit 10, is configured to be polarization-friendly (substantially devoid of paramagnetic and ferromagnetic materials) such that the transport unit 10 does not itself introduce significant reductions in the polarization level of the hyperpolarized gas therein.

Generally stated, as electromagnetic leakage is proportional to holes or openings in the housing 60, it is preferred that (as shown in FIG. 1A) the exterior housing 60 of the transport unit 10 define a substantially continuous body (without openings) to minimize the entry of electromagnetic waves inside the housing 60. Alternatively, the housing 60 can be operably associated with an additional metallic shield of high magnetic permeability which surrounds or encompasses the gas chamber(s) 30. Of course, the housing 60 can include apertures. Preferably, however, the apertures are positioned or formed on the housing 60 such that they are operably associated with a protective covering or seal (not shown) to provide sufficient housing integrity to minimize polarization loss attributed thereto.

Preferably, the bottom and top of the case 60B, 61A include at least one layer of an electrically conducting metal having a sufficient skin depth to thereby provide one or more of shielding from external electromagnetic radiation, physical protection, and support of the gas container during transport. Alternatively, or additionally, the components of the housing 60 which define the enclosure volume 65 (such as the walls and bottom 63A–63E and top 61A) include at least one layer of magnetically permeable material to provide either additional electromagnetic shielding, DC magnetic shielding, and/or a flux return. Advantageously, when multiple transport units are positioned adjacent to one another (in storage, for example), a flux return around the magnetic field generator minimizes deleterious effects to the internal magnetic holding field $B_H$ (and therefore the hyperpolarized gas) caused by the magnetic holding field in any neighboring transport unit 10.

Figure 4:
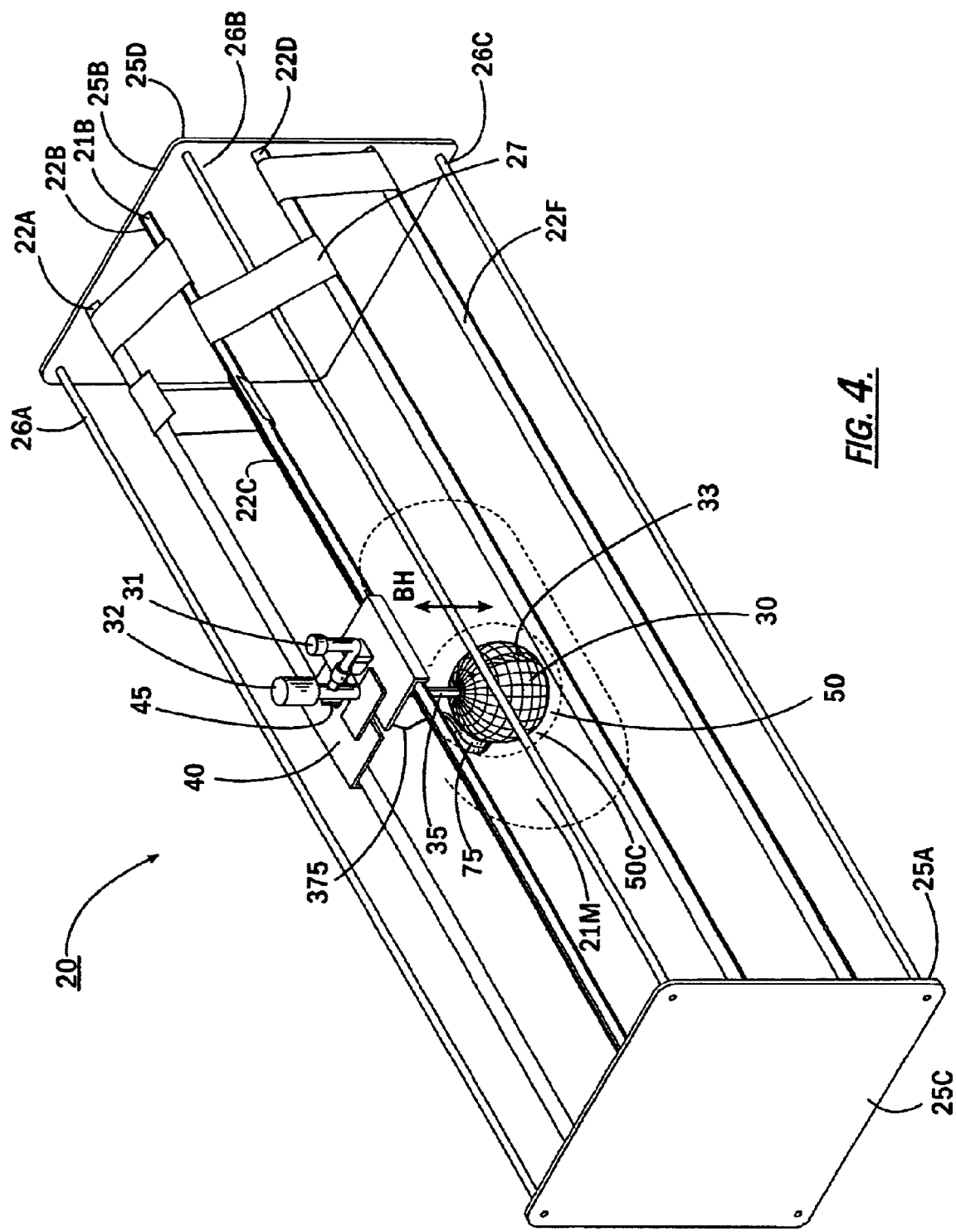
FIG. 4 is a perspective view of an alternative permanent magnet assembly according to the present invention.

Preferably, as shown in FIG. 4, the transport unit 10 comprises a face plate 40 which stabilizes and supports the gas chamber 30 in the homogeneous region 21M of the magnetic holding field $B_H$. More preferably, as shown, the face plate 40 also is sized and configured to support an upwardly extending electrical connector 45 for a NMR coil 75. This NMR coil connector 45 allows the state of the hyperpolarized gas product in the gas chamber 30 to be interrogated in position (without taking the hyperpolarized gas product out of the high homogeneity region of the magnetic field 21M). Real-time monitoring without requiring manipulation and potential exposure to depolarizing influences is desirable to determine the viability of the hyperpolarized gas, for example during transport and/or storage and just prior to use. As is also shown, the gas chamber 30 includes an exit port 31 and valve 32 in fluid communication with the main volume of the gas chamber 33. Advantageously, the face plate 40 also allows access to the valve 32 and the exit port 31 without requiring the removal of the gas chamber 30 from the magnetic field.

In a preferred embodiment, after delivery to a desired location, the valve 32 is opened and the hyperpolarized gas is released from the gas chamber 30 through the exit port 31 while the gas chamber 30 itself remains captured in the substantially enclosed housing 60 (FIGS. 1 and 1A) within the homogeneous region 21M of the magnetic field $B_H$. The housing 60 can add extra protection to personnel in the gas release area because the housing 60 surrounds a substantial portion of the gas chamber 30 therein, thereby providing a physical shield from any unplanned release or untimely breakage of the chamber itself (typically comprising an aluminosilicate glass) and which is typically transported under pressure. Further details of the preferred gas chamber 30 will be discussed below.

In its preferred operative position, as shown in FIGS. 2 and 4, the gas chamber 30 is disposed in the permanent magnet holding field configuration 20 such that the spherical or major portion 33 of the gas chamber 30 is positioned the area of high homogeneity 21M within the permanent magnet assembly 20. The positioning can be secured by suspending the gas chamber 30 from the support plate 40 (FIG. 4) and/or by positioning a non-conducting gas friendly platform 24 or base and/or holder 24A under the gas chamber 30 (FIG. 2).

Figure 6:
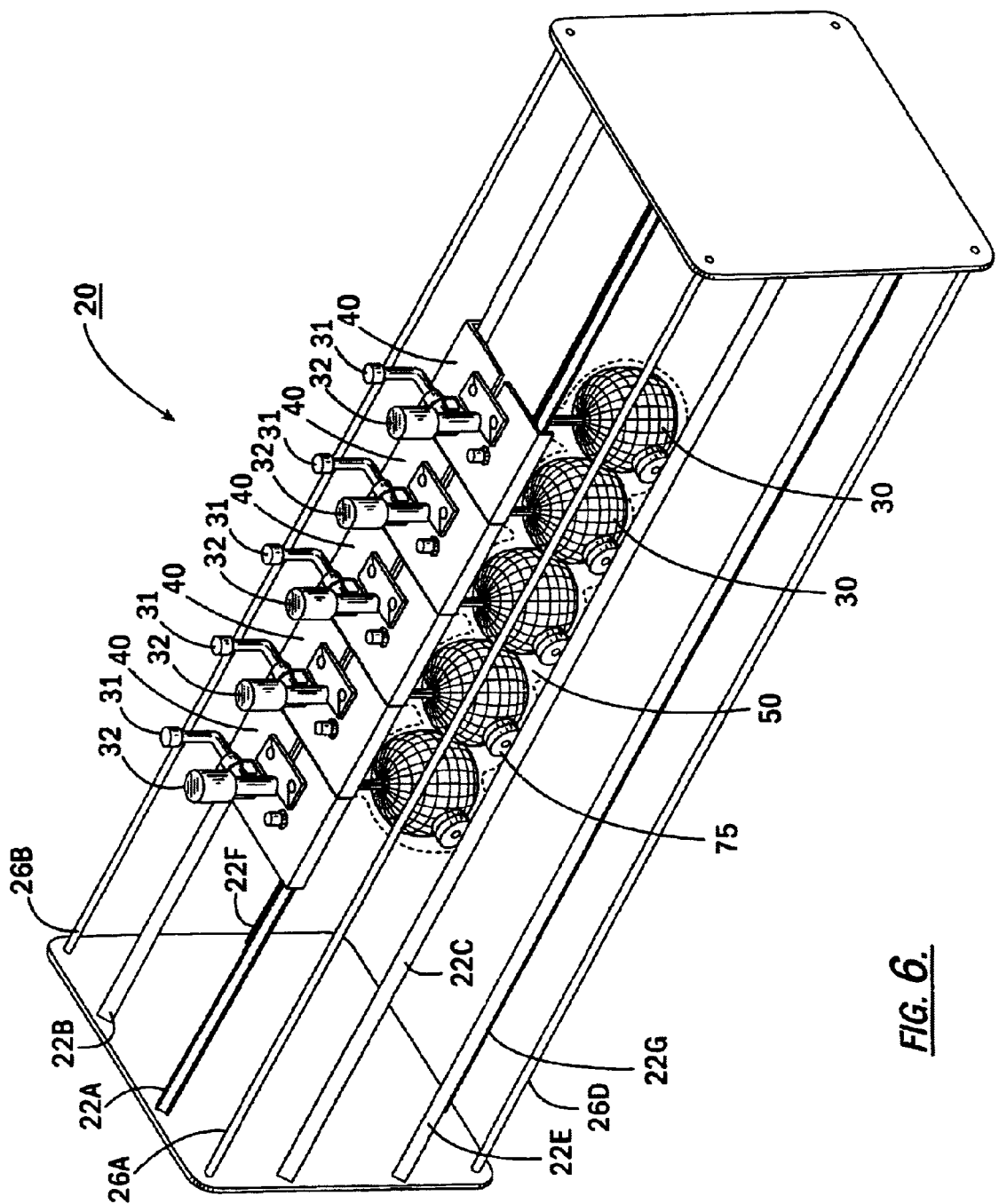
FIGS. 6 and 6A are perspective views of permanent magnet assemblies configured to transport multiple containers of hyperpolarized gas products according to the present invention.
Figure 6A:
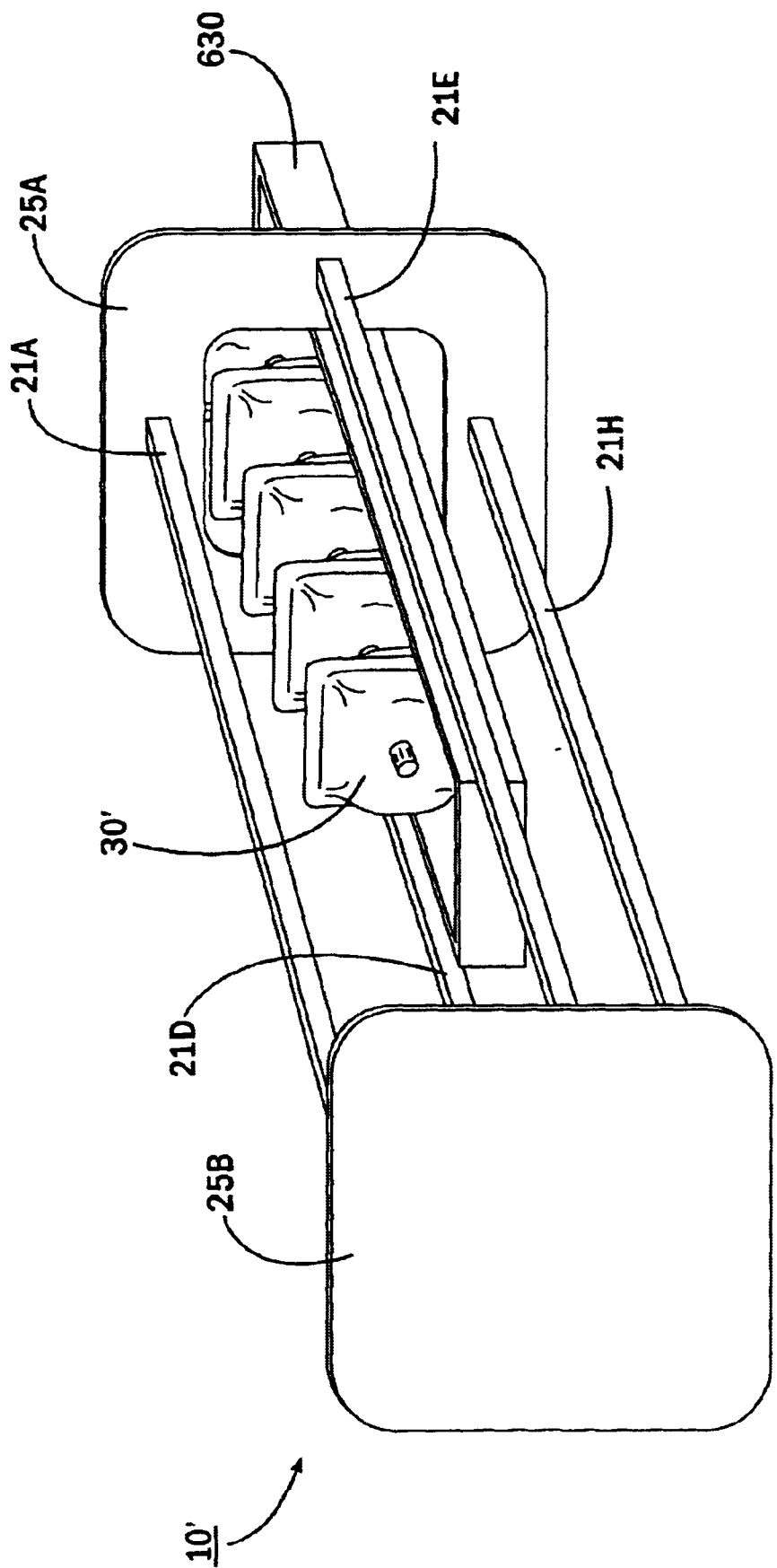

In another preferred embodiment, a tray 630 as shown in FIG. 6A can be used to support the gas chamber(s) 30'. Although FIG. 6A depicts the gas chambers 30' as resilient containers in the tray 630, rigid chambers may also be placed in a similar tray (not shown). As with all materials positioned near the hyperpolarized gas, held within the gas chambers 30, 30', the tray 630 materials must be chosen so as to minimize any deleterious affects on the polarization of the gas.

Preferably, as shown in dotted lines in FIG. 2, the gas chamber 30 is disposed in its holder 24A such that it rests on hyperpolarized gas friendly packaging 50 which acts as vibration damping material to help insulate the gas chamber 30 from undue exposure to vibration during transport. Additionally, the packaging can support the NMR coil 75 on the gas chamber 30 (i.e. keep it in position and substantially isolate it from translating).

As shown in FIG. 4, when the chamber 30 is suspended from the chamber support 40, the packing material 50 preferably extends upwardly securely and snugly around the capillary stem 35 to help cushion and insulate the chamber 30 during shipment. When multiple chambers are used, it is preferred that packing material 50 be placed between adjacent chambers 30 as well to minimize chamber damage inflicted by neighboring chambers during transport (FIG. 6). In any event, it is preferred that the gas chamber(s) 30 be securely supported in the homogeneous region 21M, since the magnetic holding field's homogeneity is spatially determined (spatially variable). Thus, translation of the gas chamber 30 thereabout can result in the hyperpolarized gas being potentially exposed to an inhomogeneous region, thereby potentially reducing the polarized life of the hyperpolarized gas product.

Turning to FIG. 2, in a preferred embodiment, the permanent magnet assembly 20 comprises a plurality of elongated permanent magnet strips 21A–21H arranged in a laterally extending cylindrical configuration for generating a substantially homogeneous static applied magnetic holding field. Suitable permanent magnets include "high force magnet strips," (part numbers HF0416 and HF1632) available from Magnet Applications located in Horsham, Pa. Of course, other magnet configurations can also be used as will be appreciated by one of skill in the art. For example, in FIGS. 1 and 1A, a cylindrical configuration of 8 magnets is used. However, as shown in FIG. 1D, additional magnets interspersed in a cylindrical configuration can be used (typically producing a more homogeneous field). Alternatively, as shown in FIGS. 1B and 1C, fewer magnets arranged in a similar spatial relationship to define a cylindrical volume in space can also be used.

Figure 2C:
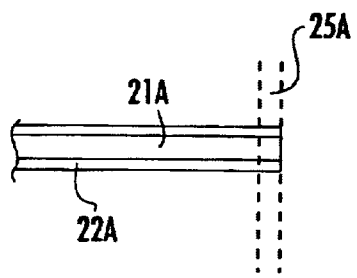
FIG. 2C is a top view of a permanent magnet and channel assembly showing the strip magnet and magnet supports mounted to the end plates according to the present invention.
Figure 2A:
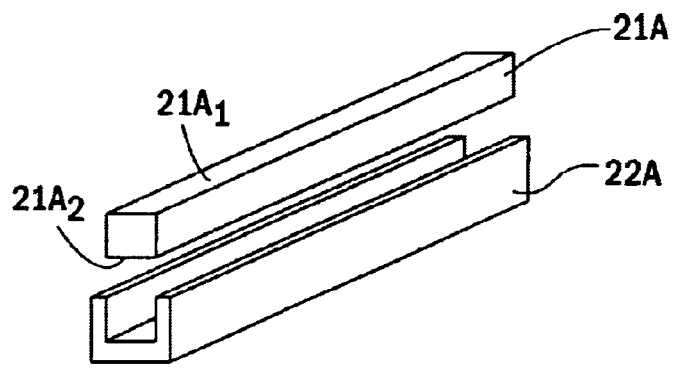
FIG. 2A is an exploded perspective view of a strip magnet and magnet support structure according to the present invention.
Figure 2B:
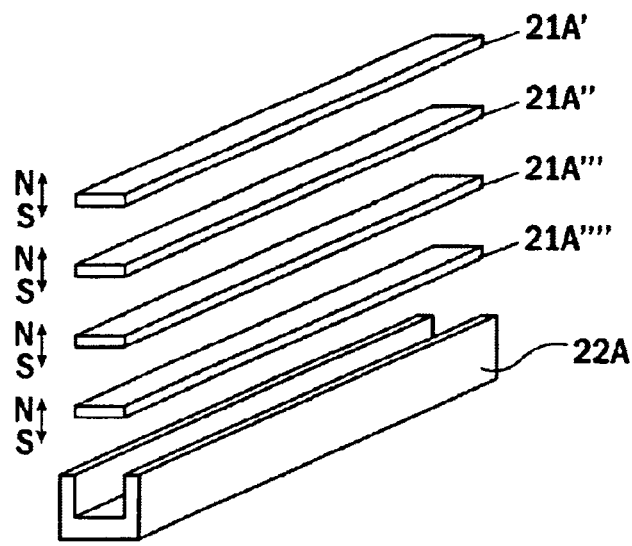
FIG. 2B is an exploded view of an alternative embodiment of a strip magnet and magnet support assembly according to the present invention.

As shown in FIG. 2, the permanent magnets 21A–21H used are preferably elongated linear flexible magnet strips. Flexible magnets are generally manufactured by embedding a permanently magnetized material in a flexible holding medium such that the magnetized material is "trapped" in the preferred pole orientation, producing the desired field. Preferred materials for the holding medium include rubber and other elastomers and polymers, so that the material itself does not deleteriously contribute to the magnetic field produced by the magnetized material embedded therein. Preferably, the magnets are magnetized with one pole per surface, meaning that a single surface of the cuboid extending the length of the magnet is magnetic north, while the opposite surface is magnetic south ($21A_1$, $21A_2$, FIG. 2A). As will be appreciated by one skilled in the art, as shown in FIG. 2B, a composite of magnets, each with a fraction of the desired strength, oriented such that they have complimentary fields (i.e., the north pole of one magnet abuts the south pole of the adjacent magnet) can be used instead of just a single magnet of the desired strength. In other words, instead of using a single magnet of the desired strength, a plurality (shown as four magnets of one quarter the desired strength) can be assembled to produce an equivalent desired field.

As shown in FIG. 2, in a preferred embodiment, the permanent magnet assembly 20 includes a holder 24 for the gas chamber 30 such that the major volume 33 of the gas chamber 30 is positioned in the homogeneous region of the magnetic field 21M (designated by dotted line). As shown, the holder 24 is a shelf which supports a chamber support cup 24A which is sized and configured to receive a portion of the gas chamber 30 therein such that the chamber 30 is substantially positioned within the homogeneous region of the magnetic field 21M. More preferably, packing material 50 is positioned in the chamber support cup 24A to retain the chamber 30 inside the chamber support cup 24A and to shield the chamber 30 from excessive shock and vibration which may be encountered during transport. Preferable materials for the packing material 50 include foam, fabric, and other insulation. Alternatively, the chamber 30 can also be supported from the top and/or sides (such as shown in FIGS. 4 and 6A).

Figure 3:
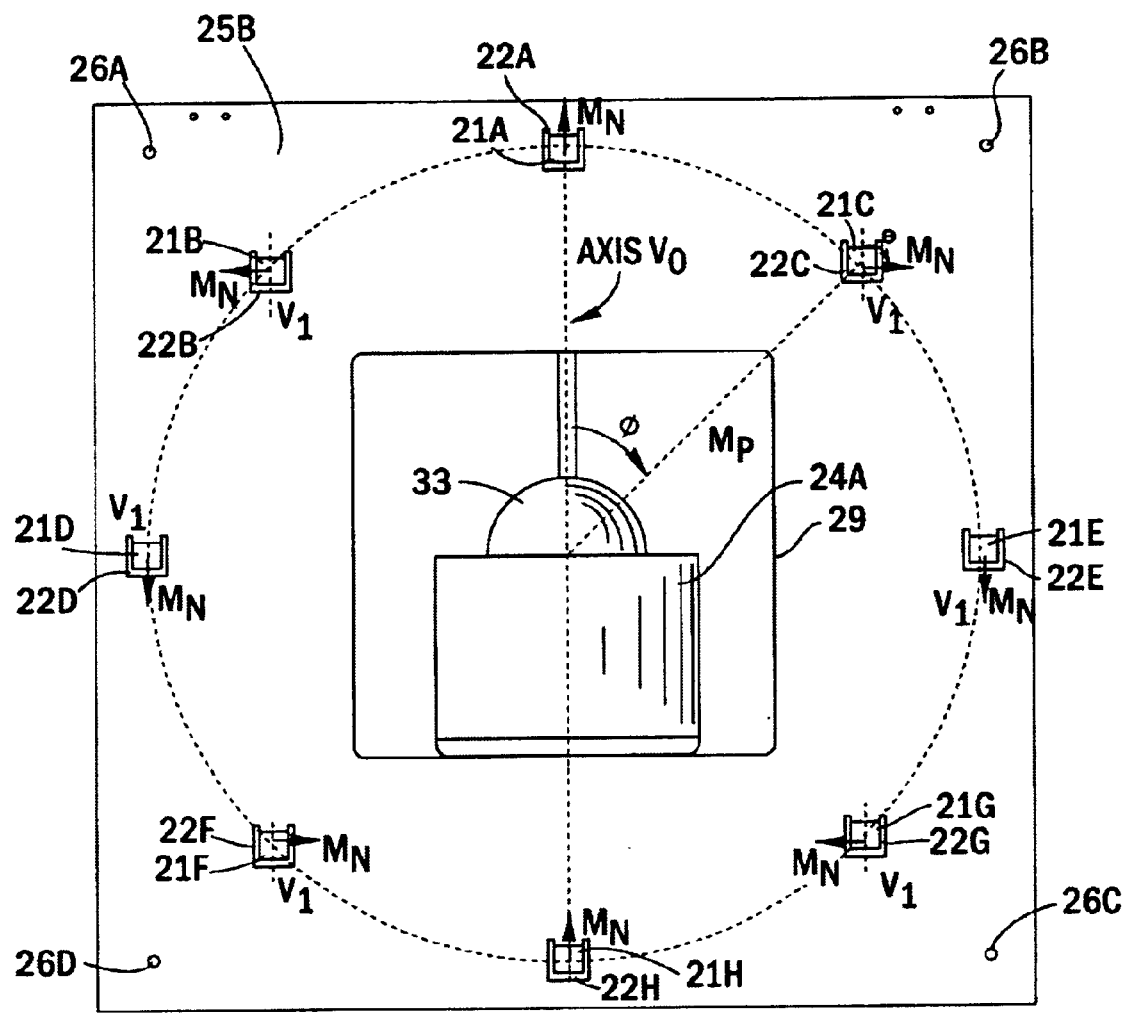
FIG. 3 is a front schematic view of the permanent magnet arrangement shown in FIGS. 1 and 2 illustrating the direction of the magnet poles according to the present invention.
Figure 3A:
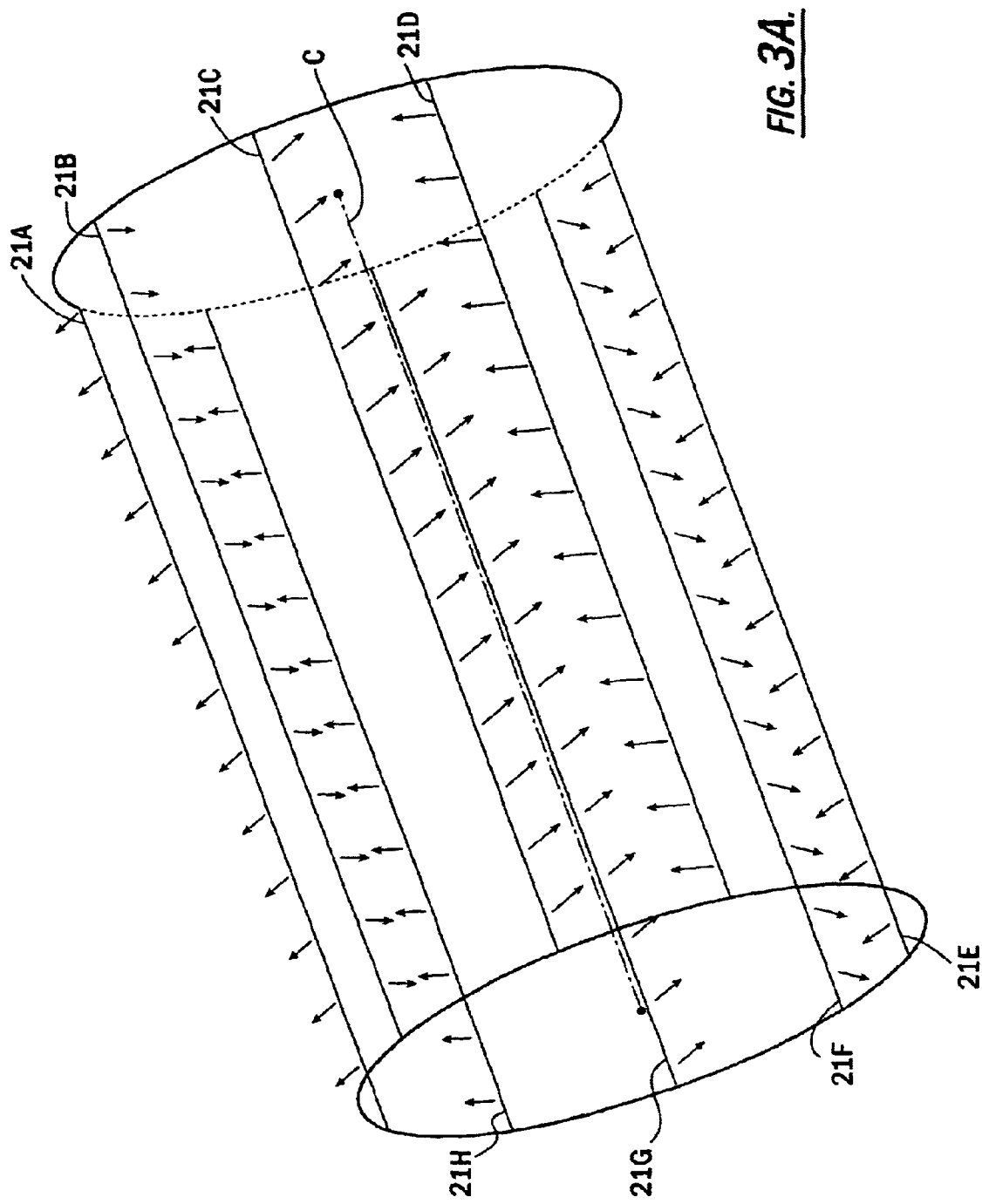
FIG. 3A is a schematic illustration of a field map indicating the direction of the magnetic field for each of the magnet strips in the permanent magnet strip arrangement shown in FIGS. 1 and 2.

Further, in a preferred embodiment, as shown in FIG. 3A, the magnet strips 21A–21H are oriented in different directions. The short arrows perpendicular to the magnets 21A–21H depict the direction of the magnetic field from each of the magnets 21A–21H. As shown, the magnetic field caused by each of the magnet strips 21A–21H is substantially perpendicular to a center longitudinal axis "C" along the length of the magnet strips 21A–21H. As shown in FIG. 3, an angle "θ" drawn between a vertical axis extending through the center of the cross section of each magnet 21A–21H (shown as axis "$V_1$") and a line drawn in the direction that the magnetic north for that magnet is facing (shown as "$M_N$") is used to describe a preferred magnetic field orientation. Similarly, an angle "φ" drawn between a vertical axis "$V_0$" drawn diametrically between the top and bottom of the circle around which the permanent magnet strips 21A–21H are arranged and a vector drawn to the position of the center of the magnet from the center of the of the vertical axis $V_0$ (shown as "$M_P$") is used to place the magnet at a preferable circumferential position. In a preferred embodiment, as illustrated in FIG. 3, the preferred angular relationship/spatial alignment between θ and φ is defined as θ=2φ.

Figure 5A:
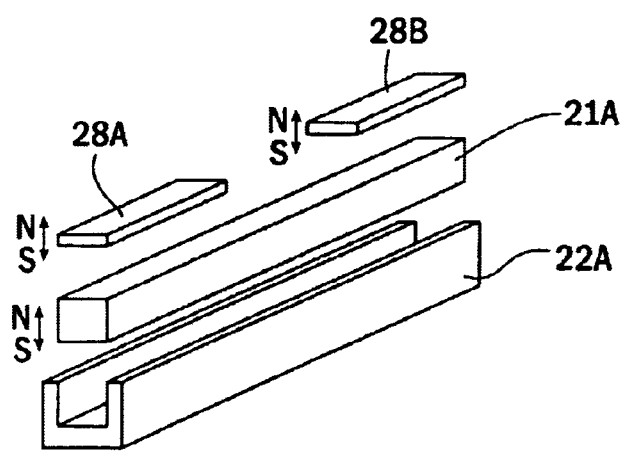
FIG. 5A is an exploded perspective view of permanent strip magnets arranged with primary and secondary magnets and their associated support channel according to the present invention.
Figure 5:
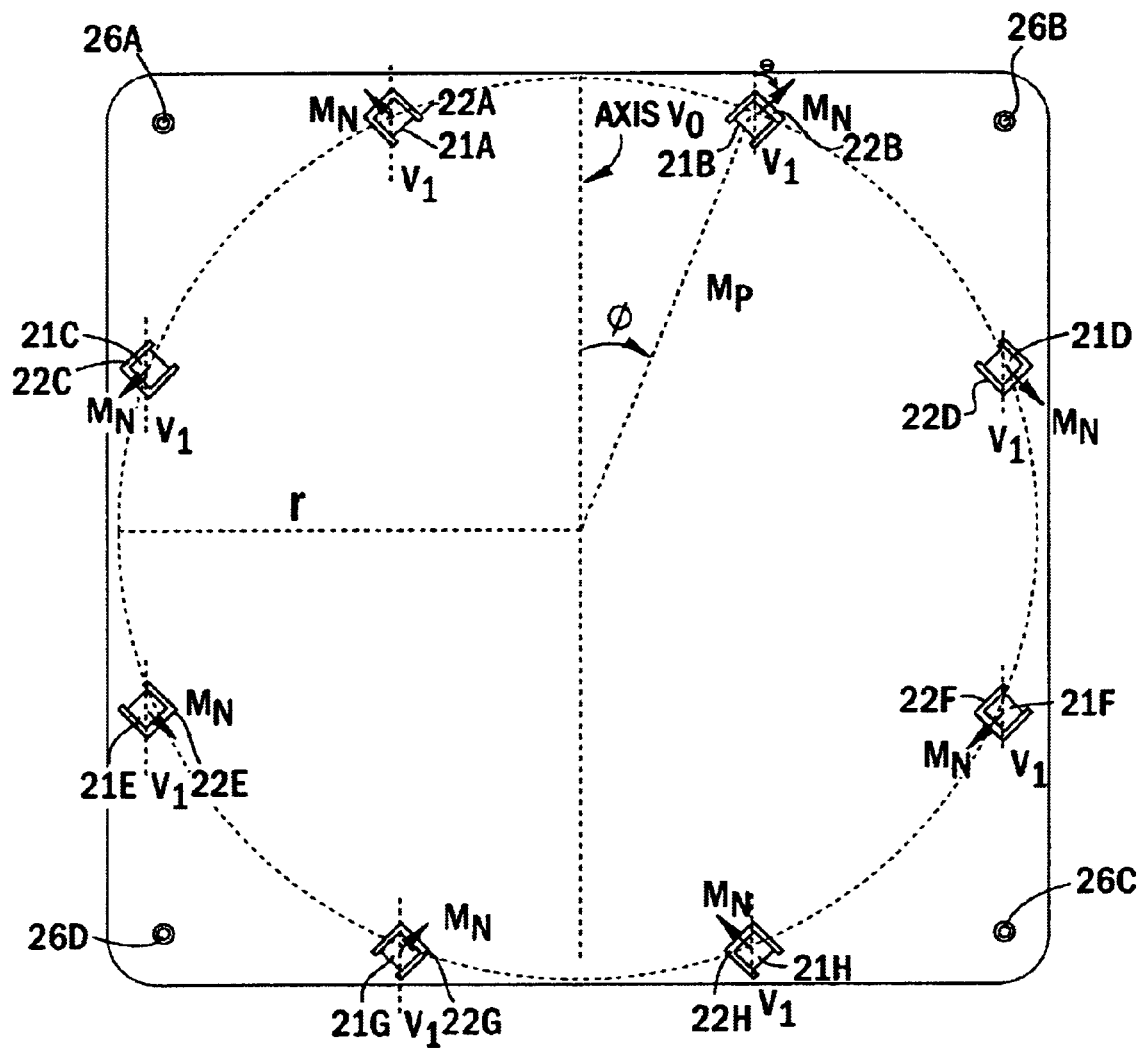
FIG. 5 is a front schematic view of the permanent magnet assembly of FIG. 4, illustrating the direction of the magnet poles according to the present invention.

In another preferred embodiment, shown in FIGS. 4 and 5, the magnet strips 21A–21H are alternately oriented differently. As shown in FIG. 5, each magnet strip 21A–21H is rotated from FIG. 3 about the center of the axis $V_0$ by about 22.5° and each magnet strip 21A–21H is rotated about its own cross-sectional center (i.e. the origin of MN in FIG. 3) by about 45°. Notably, the combination of these two rotations maintains the θ=2φ relationship. Other rotations and orientations can also be employed, but it is preferred that the angular relationship (θ=2φ) be maintained.

As shown in FIG. 4, a result of these rotations is that there is a convenient place to hang the chamber 30 from. Instead of having a single magnet strip at the top, the alternative configuration allows a chamber support/face plate 40 to straddle the top two (now substantially planar or level) magnet strips (21A, 21B) as shown in FIG. 4. This orientation facilitates support of the chamber 30 because the two magnet strips 21A, 21B can provide additional structural stability for the gas chamber 30 in this orientation. The largest portion or major volume of the chamber, where the major bolus of gas resides 33, is farthest down (in close proximity to the center of the enclosure volume 65 and within the region of homogeneity 21M). In addition or alternatively, a similar top support can be utilized to suspend the chamber 30 in other magnet configurations. For example, in the magnet orientation shown in FIG. 2, the second level of magnetic strips from the top (21B, 21C) can support a similar plate 40 and a chamber 30 as that depicted in FIG. 4.

In another preferred embodiment, as shown in FIG. 5A, smaller secondary magnetic strips 28A–28P (28C–28P not shown) are added in the direction of and along top portions of each of the primary magnetic strips 21A–21H. As shown, the secondary strips 28A, 28B are placed at each end of each magnet strip to compensate for the fall-off of magnetic field strength near the end walls of the housing 63A, 63C (at the end portions of the cylindrical shape), such that their magnetic field coincides with that of the primary magnet strips 21A–21H (i.e. the magnetic north of the secondary strip 28A–28P abuts the magnetic south of the primary strip 21A–21H it lies on). Because one secondary strip 28A–28P, is preferably placed at each end of each primary magnetic strip 21A–H respectively, there are preferably at least twice the number of secondary magnetic strips 28A–28P as there are primary magnetic strips 21A–H. These secondary magnetic strips 28A–28P each preferably constitute less than about 25% of the length of the primary strips 21A–21H. More preferably, the secondary magnetic strips 28A–28P preferably each constitute less than 20% of the length of the primary strips 21A–21H. Most preferably, each of the secondary strips 28A–28P constitutes less than 10% of the length of the primary strips 21A–21H.

Preferably, the magnetic field strength of each of the aforementioned secondary strips 28A–28P is also substantially less than that of the primary strips 21A–21H. Preferably, the secondary strips 28A–28P have a magnetic field strength of less than about 50% of the primary strips 21A–21H. More preferably, the secondary strips 28A–28P have less than about 35% of the magnetic field strength of the primary strips 21A–21H. Most preferably, the secondary strips 28A–28P have about 25% or less of the magnetic field strength of the primary strips 21A–21H.

Figure 7:
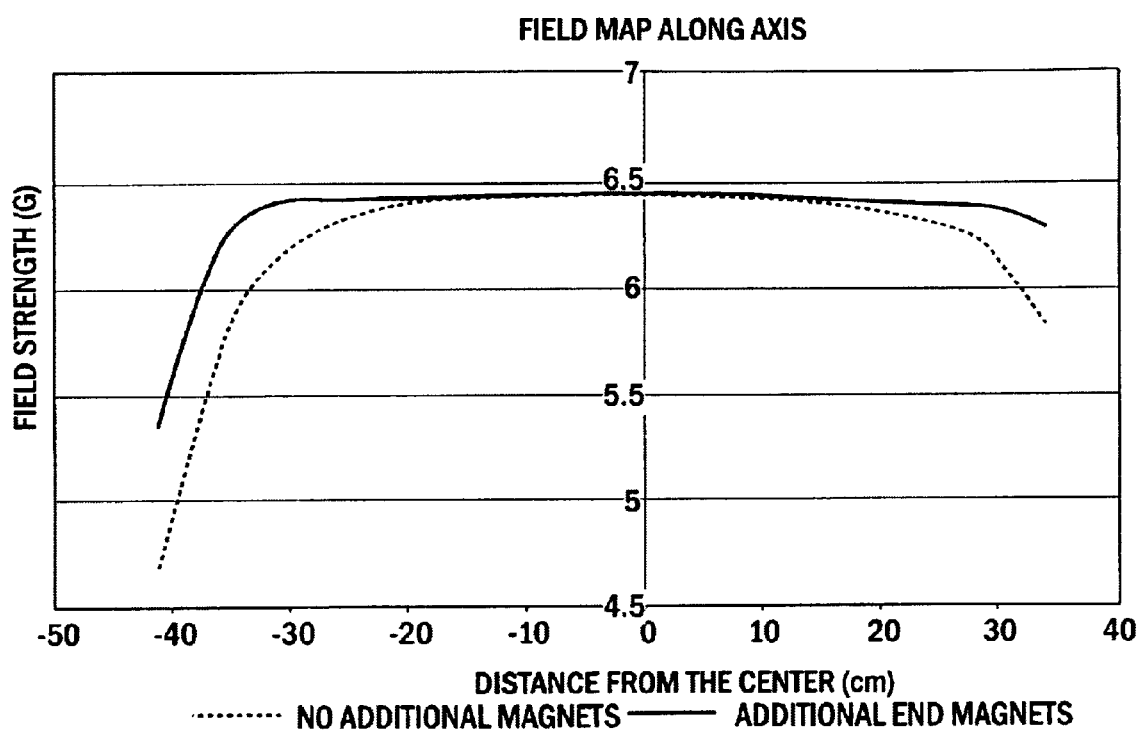
FIG. 7 is a graph of a magnetic field generated by a single homogeneous set of permanent magnets (dotted line) and a magnetic field generated by a set of permanent magnets arranged to provide increased magnetic strength (solid line) at the ends according to the present invention.

As shown in FIG. 7, secondary magnet strips 28A–28P positioned at the ends of the primary elongated magnet strips 21A–21H as described above can substantially increase the volume of high homogeneity 21M provided by the permanent magnet arrangement. The bottom dotted curve of FIG. 7 shows the magnetic field strength along the longitudinal axis C (FIG. 2) of a permanent magnet assembly 20 with only primary magnet strips 21A–21H as described hereinabove. The upper solid curve illustrates the magnetic field strength along the longitudinal axis C of the magnetic holding field $B_H$ with secondary magnetic strips 28A–28P which each constitute less than about 10% of the length of the primary magnet strips 21A–21H and wherein each have about 25% of the magnetic strength of the primary magnet strips 21A–21H.

As will be appreciated by one of skill in the art, additional magnets (tertiary, quaternary, etc.) can be further added to the permanent magnet assembly 20 to further increase the region of homogeneity 21M. Additional magnets, in a preferred embodiment, are shorter in length and of smaller magnetic field strength than both the primary 21A–21H and secondary magnets 28A–28P.

Figure 5B:
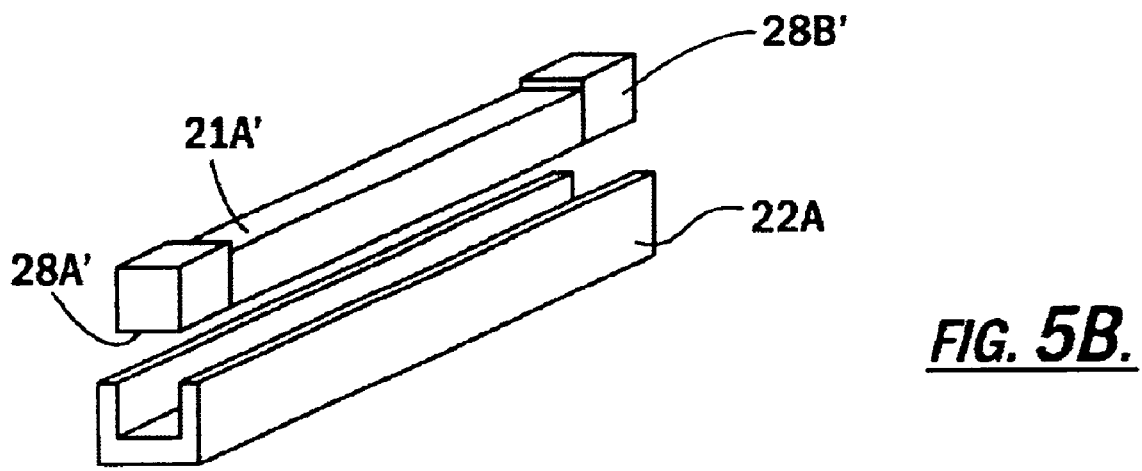
FIG. 5B is an exploded perspective view of an alternative permanent magnet configuration and its associated support channel according to the present invention.

Additionally, as appreciated by one of skill in the art and shown in FIG. 5B, instead of adding smaller, lower strength magnetic strips to the end portions of the primary magnets, equivalent structures can be made utilizing magnet strips of greater strength 28A', 28B' than that of the primary magnets 21A–21H and about the same length as the secondary magnets 28A–28P. Using these strips 28A', 28B' as substitutes for the composite primary 21A–21H and secondary 28A–28P magnet strips, and using shorter primary magnetic strips 21A'–21H', an equivalent magnet assembly 20 can be made. In other words, a single magnet of the combined strength of the primary 21A–21H and secondary 28A–28P magnets can be substituted for the aggregation of the two magnets near the ends of the housing 63A, 63C.

In a preferred embodiment, the primary magnets 21A–21H are arranged as shown in FIG. 2. Suitable magnet dimensions are ½"×½"×29½" for magnets 21A–21H, with the north and south poles perpendicular to two opposing ½"×29 ½" surfaces, such as $21A_1$, $21A_2$ (FIG. 2A). As shown, the primary magnets 21A–21H are arranged such that the center of the cross section of the magnets are circumferentially placed as shown in FIG. 2 on a circle with a radius "r" of about 8 inches. These magnets 21A–21H can preferably be placed in structural angles, bars, or other structural extrusions such that the magnets are supported (i.e., kept from sagging) and maintained in a substantially linear alignment to minimize side-to-side deviations or variations.

As shown in FIG. 2A, in a more preferred embodiment, magnets 21A–21H are placed inside channels 22A–22H for support. In one preferred embodiment, the channels 22A–22H are formed of aluminum channels (such as ¾"×¾"×⅛", 30" long). In another preferred embodiment, the channels 22A–22H are plastic.

In the embodiment shown in FIG. 4, the magnetic strips 21A–21H are ¼"×¼"×35" long, with the magnetic north and south poles oriented perpendicular to two opposing (i.e. a top and a bottom surface) ¼"×35" faces, such as $21A_1$, $21A_2$ (FIG. 2A). In one preferred embodiment, the centers of the cross section of the magnets are arranged on a circle with a 5 inch radius. As with the other preferred embodiment, the magnets 21A–21H are supported by mechanical means (channel, bar, angle) 22A–22H. As with all permanent magnet arrangements, the radius "r" of the circle that the magnets (21A–21H, 28A–28P) are arranged about and/or the length, width, and thickness of the magnets can be altered to increase or even optimize the region of high homogeneity for the gas chamber(s) 30 used.

As shown in FIG. 2, in a preferred embodiment, structural alignment and stability for the permanent magnet strips 21A–21H is maintained through attachment to upstanding endwalls or end plates 25A, 25B and bars 26A–26D. The end plates 25A, 25B serve to place the magnets 21A–21H and corresponding channels 22A–22H in the desired spatial position with respect to the other magnets as well as to maintain the desired magnetic field orientation of each magnet. In other words, the attachment of the individual primary magnets 21A–21H to the end plates 25A, 25B serves to fix "r," "θ" and "ϕ" (FIGS. 3 and 5). The endwalls or endplates 25A, 25B do not need to be a single element per side, nor do they need to be flat in nature. Thus, as used herein, the term "endwall" or "end plate" describes one or more structural supports associated with the permanent magnet assembly 20 used to hold a magnet's position with respect to the other magnets 21A–21H. In a preferred embodiment, as shown in FIGS. 2, 2C and 3, the channels 22A–22H are slightly longer than the permanent magnets 21A–21H. Additionally, the end plates 25A, 25B have slots through which the channels 22A–22H slide. Because the slots in the end plates 25A, 25B are not large enough for the magnet/channel assembly to fit through, the magnet strips 21A–21H are securely retained in position between the end plates 25A, 25B. As shown in FIG. 2C, the ends of the shorter permanent magnet strips 21A–21H can thus abut the inner surface of the end plates 25A, 25B (i.e., the sides closest to the chamber(s) 30) while the outer ends of the channels 22A–22H are flush with the outer surface of the end plates 25A, 25B (shown by dotted lines).

In another preferred embodiment, as shown in FIGS. 4 and 5, the channels 22A–22H are substantially the same length as the primary magnet strips 21A–21H. With this embodiment, the apertures formed in the end plates 25A, 25B are sized to be large enough to accommodate both the magnets 21A–21H and channels 22A–22H. As shown in FIG. 4, to help keep the magnet 21A–21H/channel 22A–22H assemblies in position (to prevent sliding), addition of a third and a fourth end plate 25C, 25D adjacent to and on the outside of the end plates 25A, 25B (i.e., on the outer side of end plates 25A, 25B, away from the chamber 30) is preferred. The third and fourth end plates 25C, 25D are substantially solid (i.e., they have holes for neither the magnets 21A–21H nor the channels 22A–22H).

As shown in FIG. 4, additional structural elements can be used to align the magnets defining the holding field $B_H$. Cross-support bars 26A–26D serve to both fix the distance between the end plates 25A, 25B and to hold the entire permanent magnet arrangement 20 together. In a preferred embodiment, clamps 27 such as those shown in FIG. 4 can serve to increase structural stability. As depicted in FIG. 4, these clamps 27 anchor one channel 22A–22H to its adjacent neighbor channel, thereby increasing the structural rigidity and integrity of the entire assembly 20.

Materials and structural elements are preferably chosen such that transport unit's 10 weight and any depolarizing affect on the hyperpolarized gas held in the gas chamber 30 is minimized. As such, the bars 26A–26D (FIG. 2) are preferably hollow and the materials chosen for the structural elements (angle, channel 22A–22H, bar 26A–26D, end plates 25A–25D) preferably comprise a lightweight, structurally strong, non-depolarizing material such as plastic, aluminum, or titanium.

The net magnetic field $B_H$ from the permanent magnet assembly 20 is preferably configured to predominantly coincide with the earth's magnetic field. Because reversing field direction adversely affects the state of the hyperpolarized gas (i.e. depolarization occurs), this orientation can significantly prolong the lifetime of the hyperpolarized gas. Orienting the net magnetic field to coincide predominantly with the earth's magnetic field minimizes the adverse effects to the hyperpolarized gas when removing it from or inserting it into the transport unit 10.

Additionally, to further prevent unnecessary depolarization of the gas due to changes in magnetic field direction, end access ports 29 such as those shown in FIGS. 2 and 3 facilitate easy removal and positioning of the chamber 30 in the homogeneous region of the magnetic field 21M without requiring the container 30 to move through a region of field direction change and without requiring the disassembly the permanent magnet assembly 20. It is advantageous to be able to keep the permanent magnet assembly 20 intact so that gas removal can occur anywhere regardless of the ambient field, to minimize adverse effects to the hyperpolarized state of the gas, and facilitate operational convenience. This access port 29 can be covered with another panel to enclose the gas chamber 30, or the permanent magnet assembly 20 can be inserted inside an additional housing (not shown).

Figure 13:
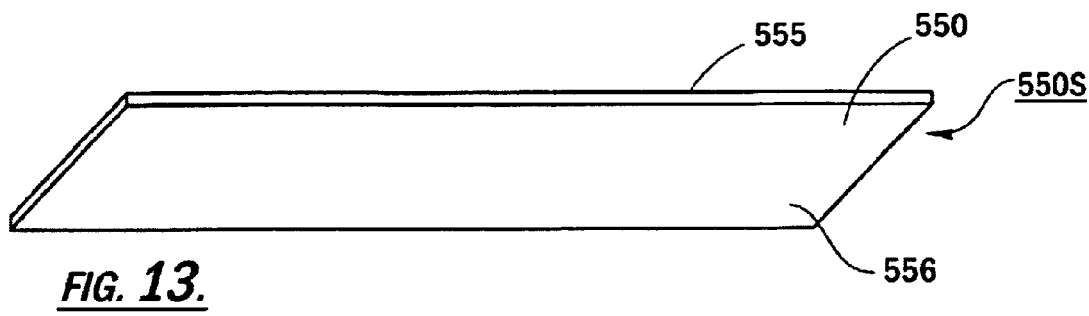
FIGS. 13 and 13A–C are perspective views of a flexible magnet sheet magnetized and configured to provide a cylindrical magnetic holding field according to the present invention.
Figure 13A:
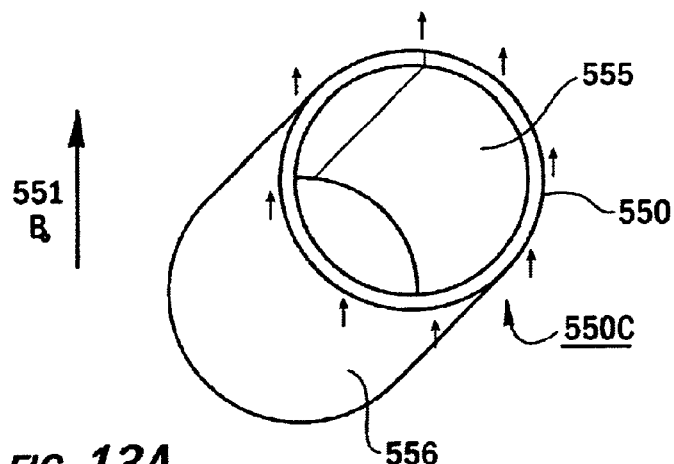
Figure 13B:
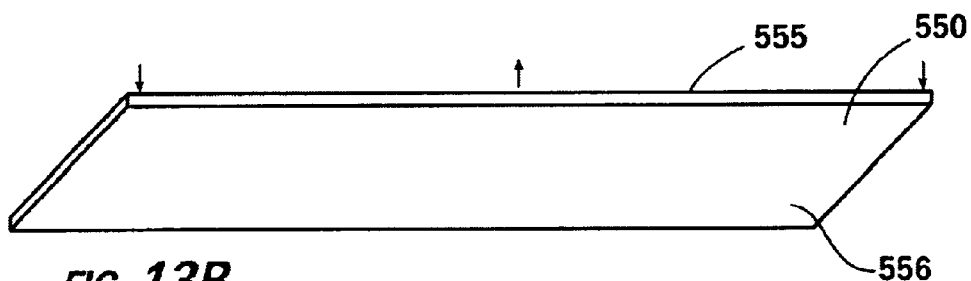
Figure 13C:
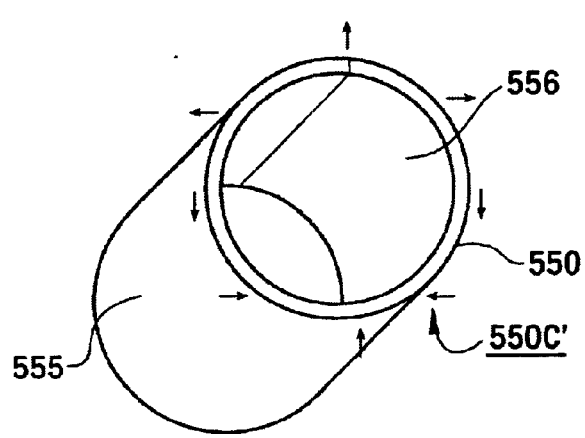

Alternative configurations for permanent magnets arranged to provide a magnetic holding field $B_H$ approximating a cylindrical volume projected in space are also possible substantially maintaining the $\theta = 2\phi$ relationship described above. For example, as shown in FIGS. 13 and 13A, a flexible sheet 550S can be embedded with magnetizable material 550 which is then configured (rolled) into a cylindrical shape and oriented with side 555 on the inside surface and 556 on the outside surface. Preferably, the cylinder 550C is formed by abutting without overlapping the ends of the flexible sheet 550S. A strong magnetic field $B_0$ 551 is applied to magnetize the material while the flexible material sheet 550S is held in the cylindrical configuration, creating a magnetic cylinder 550C (with magnetization as indicated by the small arrows). If the magnetic cylinder 550C is then opened back to sheet form as shown in FIG. 13B, and then rolled in the opposite direction as shown in FIG. 13C, with side 555 on the outside and side 556 on the inside, a cylinder 550C' with the desired $\theta = 2\phi$ angular magnetization relationship can be formed (the magnetization is shown by the direction of the small arrows.) This is another alternative way to approximate a cylindrical magnetic volume projected in space using a permanent flexible magnet structure. The resulting magnetic cylinder 550C' can therefore be placed in a housing 60 as the magnetic field generator 20.

While the cylindrical arrangements of permanent magnets described above is very effective at producing a homogeneous magnetic field, other permanent magnet arrangements can also provide a magnetic field with sufficient homogeneity to transport and store hyperpolarized gas. One such arrangement involves approximating a spherical shell geometry with discrete magnets.

As shown by Coey, J. M. D., in Rare-earth Iron Permanent Magnets, the magnetic field produced by a continuous magnetized shell (i e., a hollow sphere magnet) can be analyzed. For a spherical shell with outer diameter "b" and inner diameter "a", inside the shell, the magnetic field B is homogeneous with a magnitude of $$B = \frac{16\pi M}{3} \ln\left(\frac{b}{a}\right) \qquad 2.5$$

where "M" is the scalar field strength of the magnetized shell.

However, hyperpolarized gas cannot be easily placed into a spherical shell without substantially deleteriously affecting the magnetic field inside the shell. Additionally, manufacturing such a magnetized shell can be difficult and expensive. Alternatively, however, it is possible to approximate a spherical shell using discrete permanent magnets. Designs based on spherical geometry approximations are more advantageous than the magnetized spherical shell because spherical shell approximations can be easier to manufacture and can allow insertion and removal of a chamber filled with hyperpolarized gas without affecting the magnetic field.

Figure 12:
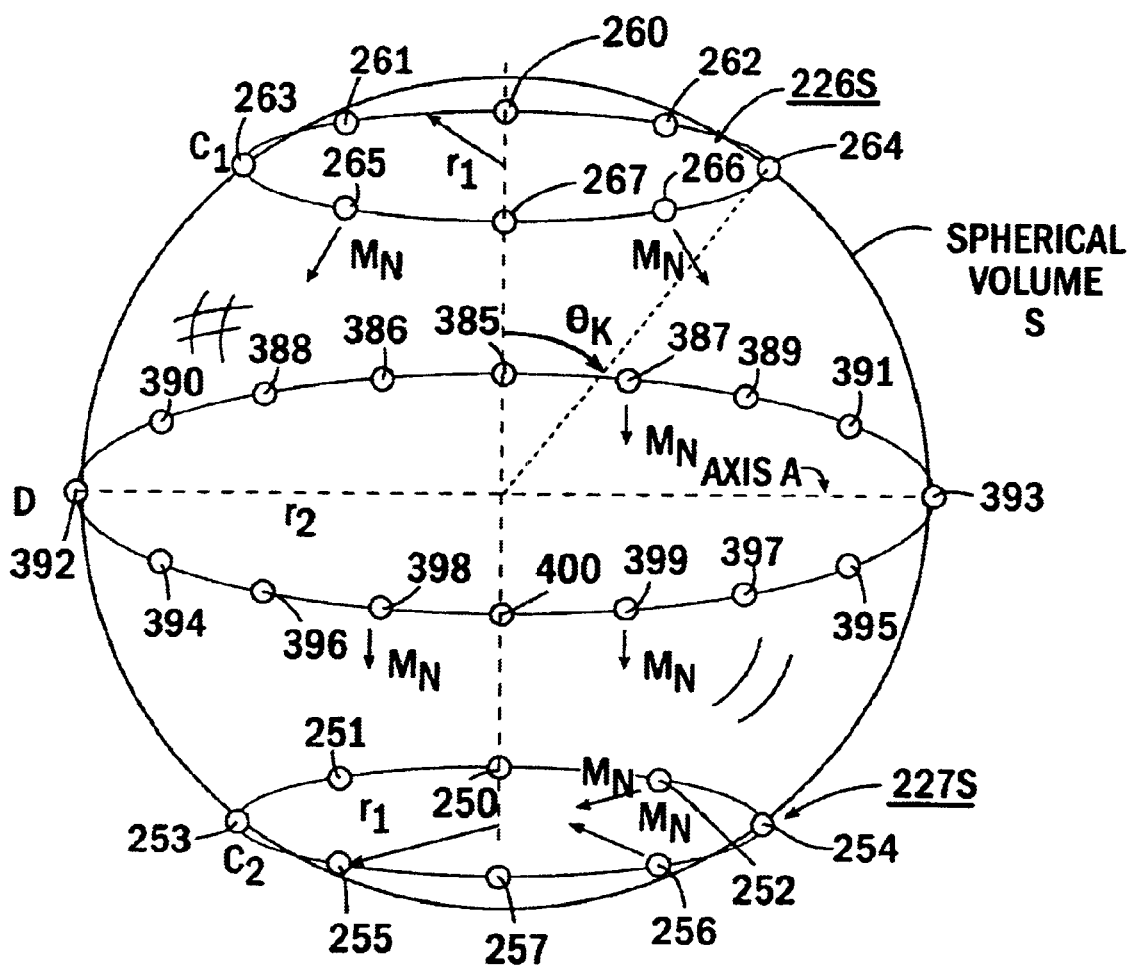
FIG. 12 is a perspective schematic view of a permanent magnet arrangement approximating a magnetized spherical shell arranged as shown in FIG. 11 according to the present invention.

FIG. 12 illustrates one way discrete permanent magnets can be placed such that they define a spherical volume "S" projected in space. Three rings of magnets $C_1$, $C_2$, and D are placed such that they lie on a spherical volume projected in space. Each non-equatorial ring $C_1$, $C_2$ of "q" magnets (250–257, 260–267) has a colatitude angle "$\theta_k$," with magnets evenly spaced about the non-equatorial ring $C_1$, $C_2$. Also assume that each magnet is tipped away from the symmetry axis (shown in FIG. 12 as "A") by angle "$2\theta_k$" and $\theta_k$ can then be chosen such that the resulting magnetic potential $\Phi$ is represented by the equation:

$$\Phi(R) = 2nqM\left[\frac{-4z}{3} + \sum_{l=8n+1}^{\infty} R^l \sum_{m=-l}^{l} C_{lm} Y_{lm}(\theta\varphi)\right] \quad 2.6$$

where "M" is the magnetic moment for a discrete magnet, "$Y_{lm}$" is a spherical harmonic and "$C_{lm}$" is a coefficient determined by the placement of the magnets. Therefore, the magnetic field along the z axis from "n" pairs of rings is $$H_0 = 2nqM(4/3) \quad 2.7$$

The optimum placement angles $\theta_k$ for "n" pairs of rings are determined by the projections $z_1 = \cos\theta_1 z_2 = \cos\theta_2 \ldots z_n = \cos\theta_n$. $z_k$ (and therefore $\theta_k$) can be determined by the set of "n" simultaneous equations:

$$\begin{bmatrix} z_1^2 + z_2^2 + \ldots + z_n^2 = \frac{n}{3} \\ z_1^4 + z_2^4 + \ldots + z_n^4 = \frac{n}{5} \\ \ldots \\ z_1^{2n} + z_2^{2n} + \ldots + z_n^{2n} = \frac{2}{2n+1} \end{bmatrix} \quad 2.8$$

For example, for "n"=2, the solution to the pair of simultaneous equations gives:

$$z_1 = \left[\frac{1}{3} + \frac{2\sqrt{5}}{15}\right]^{1/2} \quad 2.9$$

$$z_2 = \left[\frac{1}{3} + \frac{2\sqrt{5}}{15}\right]^{1/2}$$

Additionally, for "2n" rings the mean magnetic potential "$\Phi$" per magnet, as "n" approaches infinity is $$\Phi \to -4z/3 \text{ for } |z|<1 \quad 2.10$$

Figure 9:
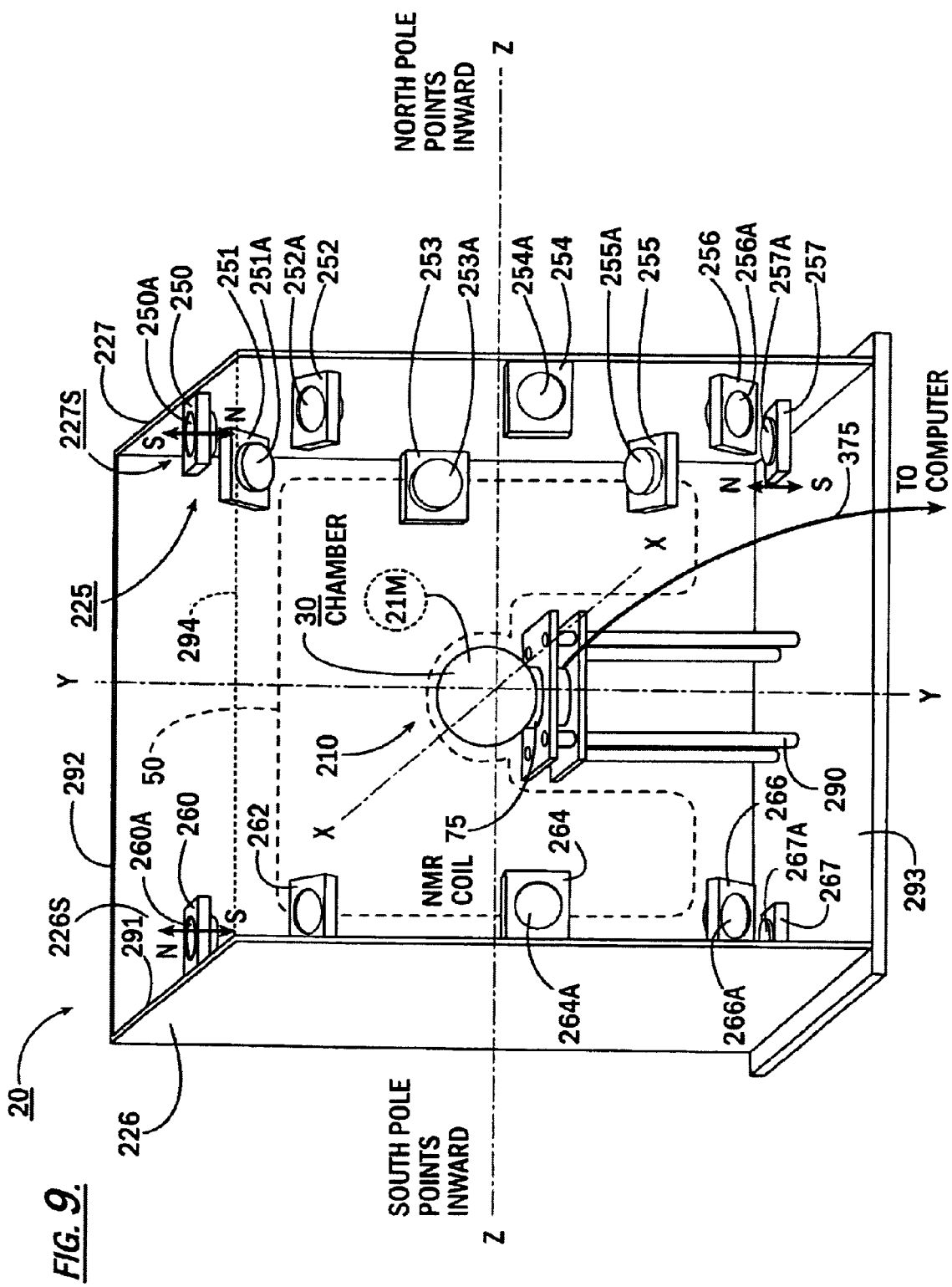
FIG. 9 is a front cutaway view of a permanent magnet assembly according to the present invention.
Figure 10:
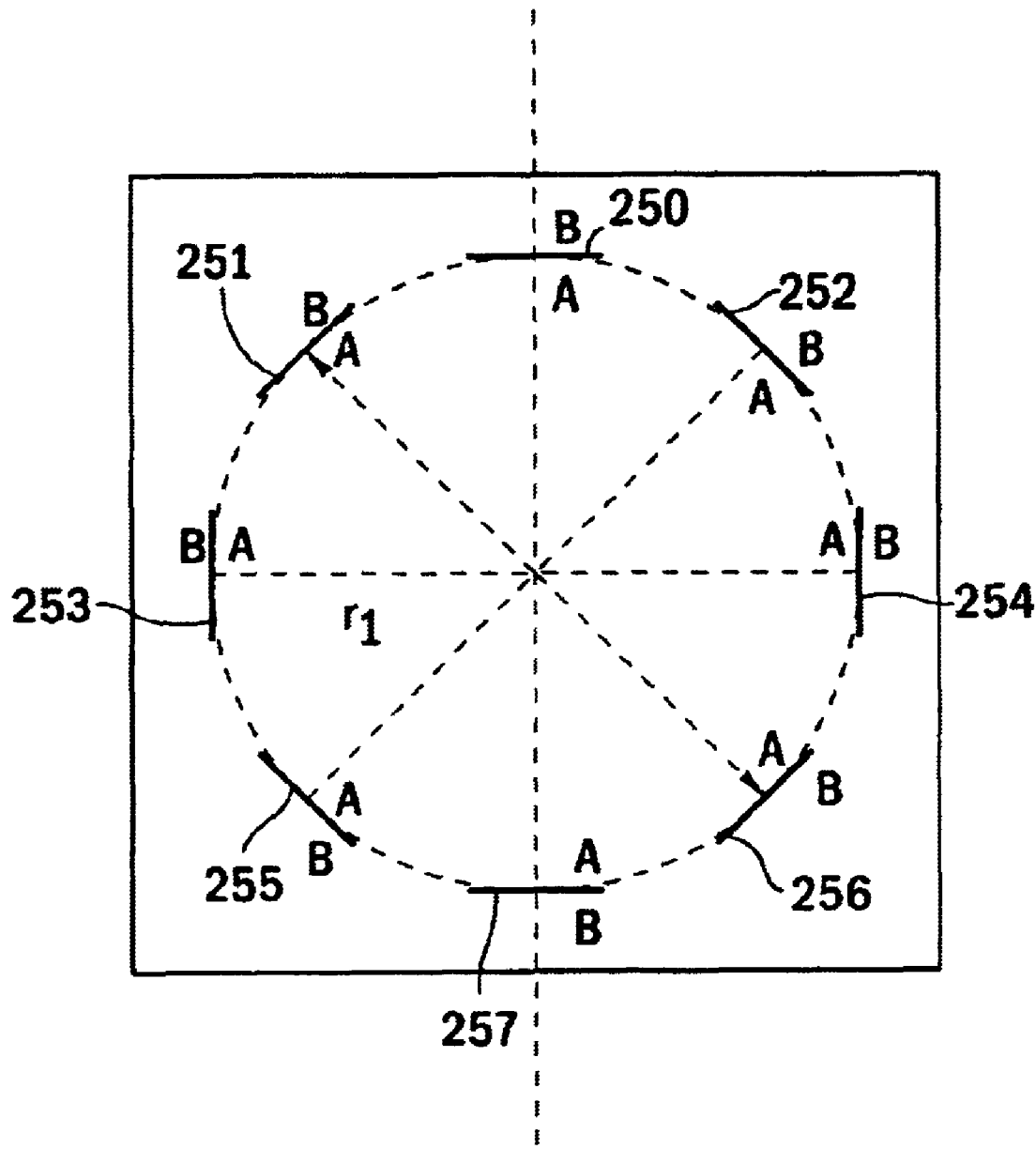
FIG. 10 is a side schematic view of the embodiment depicted in FIG. 9, showing the direction of the magnetic field and placement of the individual permanent magnets associated therewith according to the present invention.

Accordingly, a preferred embodiment for an alternative arrangement of permanent magnets is configured to substantially represent or approximate a spherical geometry as shown in FIG. 9. This magnetic field generator 20 can be assembled from permanent magnets such as disk magnets identified by part number D00150350Z, NdFeB 1"×0.375" N-35 available from Tridus International, in Paramount, Calif. As shown, the chamber 30 is again centrally located in a magnetic field $B_H$ created by an arrangement of permanent magnets. Cuboid magnet holders 250–257 and 260–267 (261, 263, and 265 not shown) for each permanent magnet 250A–257A and 260A–267A (261A, 263A, and 265A not shown) orient the magnets circumferentially apart and maintain the desired angle $2\theta_k$ (FIG. 10). End plates 226 and 227 furthermore place and positively hold each permanent magnet holder 250–257 and 260–267 in its appropriate place and orientation. FIG. 10 depicts one such plate 227 from the side. Here, the orientation of each permanent magnet holder 250–257 and respective permanent magnet 250A–257A (shown as the disks or short cylinders in FIG. 9) inside each permanent magnet holder 250–257 is shown. As FIG. 10 shows, the magnets 250A–257A and magnet holders 250–257 and are arranged so as to be equally spaced apart around the circumference of a circle, whose radius is $r_1$. Furthermore, as shown, the magnets are oriented such that magnetic north points inward, toward the center of the circle around which they are arranged (shown on magnets 250A and 257A in FIG. 9 and depicted by "A" in FIG. 10) and therefore magnetic south points outward (depicted by "B" in FIG. 10). As shown in FIG. 10, end plate 226 is similarly configured to end plate 225, with magnets 260A–267A (261A, 263A, and 265A not shown) and magnet holders 260–267 (261, 263, and 265 not shown) similarly arranged about a circle with radius $r_1$. For plate 226, magnetic south points inward (as shown by magnet 260A in FIG. 9 and "A" in FIG. 10) and magnetic north points outward ("B" in FIG. 10).

In one preferred embodiment, as shown in FIG. 9, two opposing magnet sets 226S, 227S, each having eight one inch disk magnets, are arranged equally around a circle (total of sixteen magnets). Each circle has a radius of approximately 6 inches, where the circles of each magnet set 226S, 227S are aligned on parallel planes approximately 10⅝ inches apart. The magnets are arranged such that each magnet has a diametrically opposing magnet within its magnet set 226S, 227S (across the same ring on which it lies) as well as a corresponding magnet directly across it on the other spaced apart ring. The magnets are arranged such that their fields are parallel to the respective end plate 226, 227 on which they reside. It is also preferred that the structural components (magnet holders 250–257, 260–267, end plates 226, 227, 293) comprise aluminum. The magnetic fields of all of the magnets are oriented as shown in FIG. 9 and described hereinabove.

Furthermore, as shown in FIG. 9, the chamber 30 rests on or in a holder 290 so that its position is maintained in the central and therefore homogeneous region of the magnetic holding field $B_H$. Additionally, a NMR coil 75, connected to a computer via a cable 375 is advantageously placed next to the chamber so that non-invasive measurements of polarization can be taken at any time as described earlier above. In a preferred embodiment, the chamber 30 is also supported in the region of homogeneity 21M by vibration isolation packing material 50 shown by the dotted line in FIG. 9.

In one preferred embodiment, the transport unit 10' further includes shielding means. Structural plates 226, 227, 292, and 293 can act as a magnetic shield if configured, sized, and/or positioned appropriately as described in the shielding section hereinabove. However, additional shielding can also be added, such as a high permeability metal which can also act as a flux return. The addition of high permeability metal may also compensate for the edge effects of the permanent magnet field, if designed properly as will be appreciated by one of skill in the art.

Advantageously, with the design depicted in FIG. 9, a user can easily remove the chamber 30 from the transport unit magnetic field without substantially disturbing or altering the magnetic field.

Figure 11:
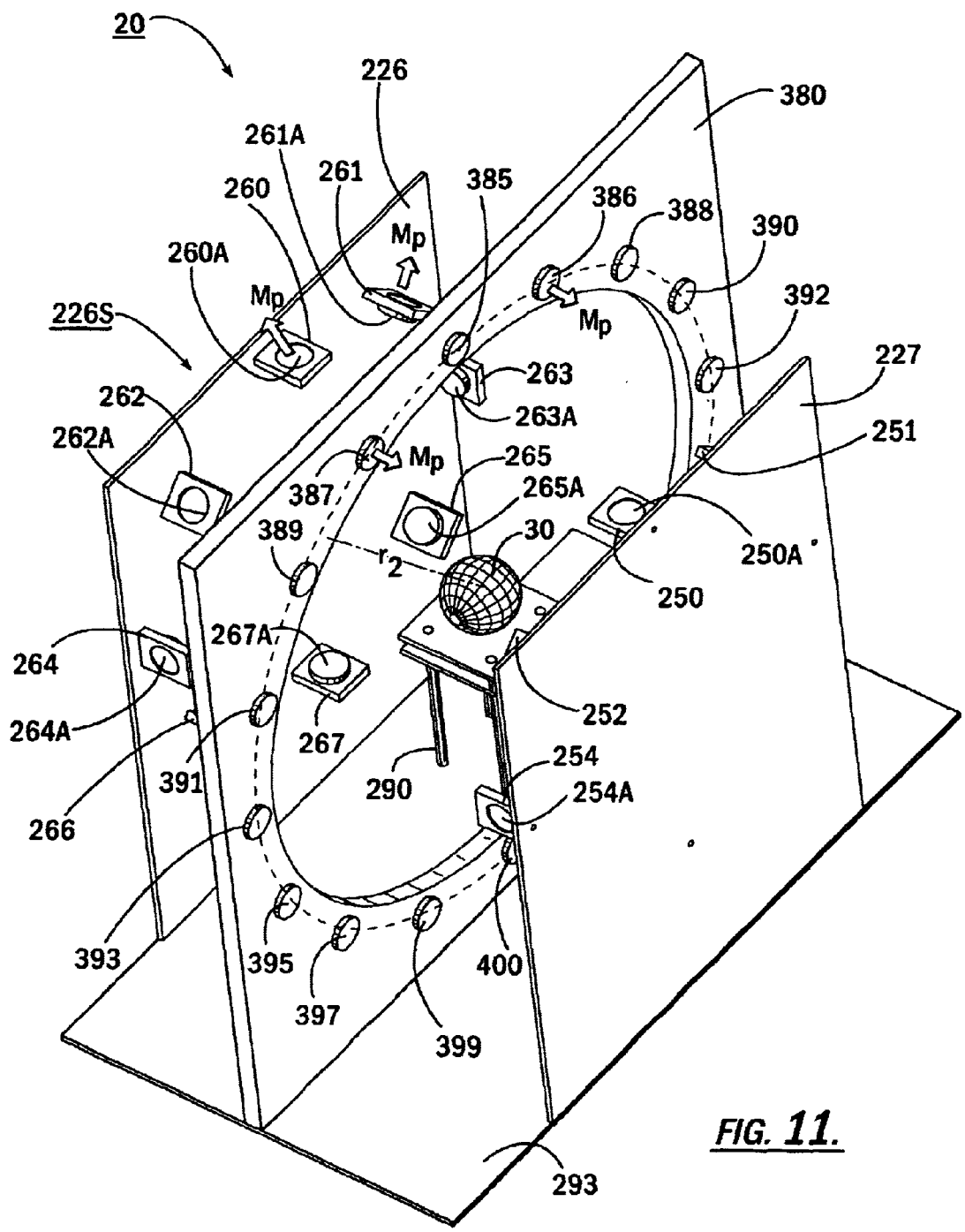
FIG. 11 is a perspective view of another permanent magnet assembly according to the present invention.
Figure 11A:
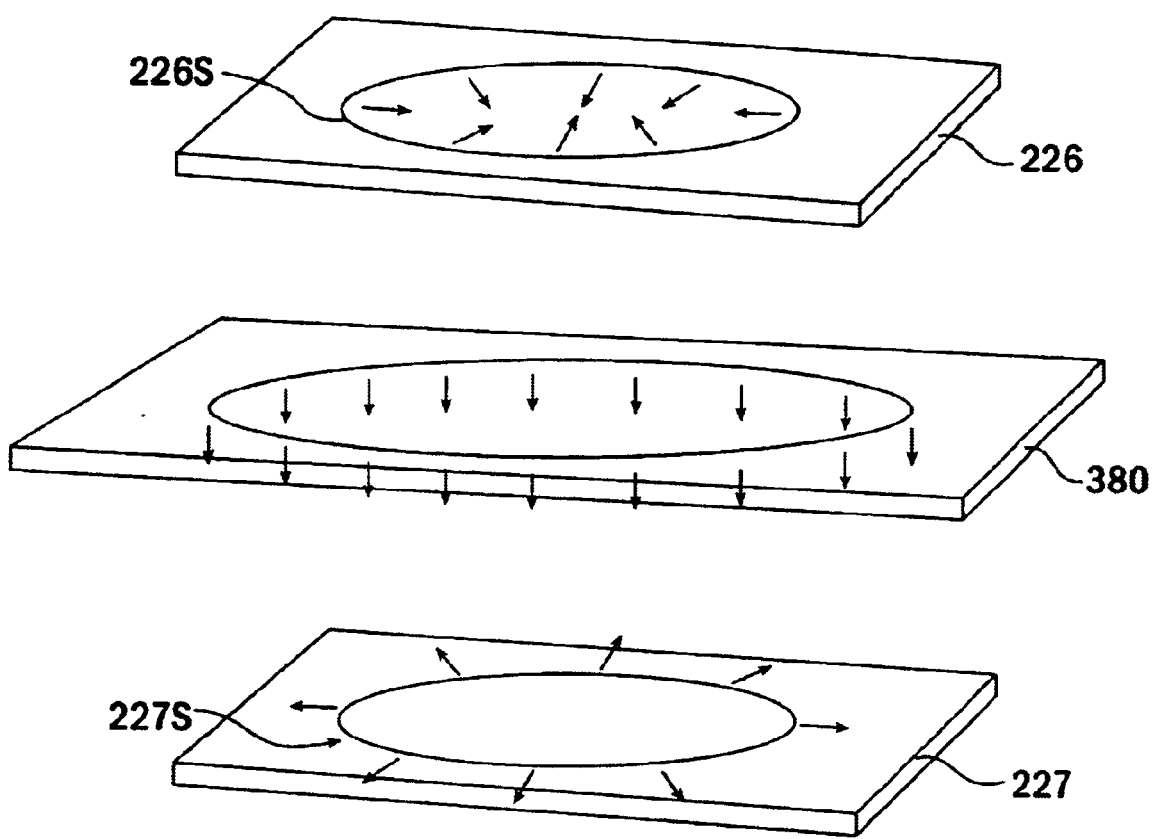
FIG. 11A is a schematic illustration of the direction of the magnetic field for the permanent magnets arranged according to FIG. 11 according to the present invention.

As shown in FIG. 11, additional magnets can also be added to the magnet arrangement of FIG. 9. A third plate 380 holds additional magnets 385–400 in position to increase the homogeneity and strength of the magnetic field. Again, the additional magnets 385–400 on the third plate 380 are preferably circumferentially arranged on a circle with a radius "$r_2$", as shown in FIGS. 11 and 12. In one preferred embodiment, the third plate 380 is positioned such that the center of the ring of magnets 385–400 is precisely located at the center of the magnetic field $B_H$ (and preferably at the center of the chamber 30 if a single chamber is held therein, or in the center of a plurality of chambers if more than one chamber is held therein). Therefore, using equations 2.6 to 2.8, the equatorial positioned "third ring" (shown as D in FIG. 12) acts as two rings of "q" magnets each directly on top of one another at $\theta_k=90°$ and thus has twice the number of magnets (2q) compared to the non-equatorial rings of magnets described above. Furthermore, preferably the ratio $r_1/r_2$ ($r_1$ being the radius of the circle on which the non-equatorial magnet sets 226S, 227S are arranged (shown as positioned on the end plates 226 and 227 in FIG. 10)) is about 0.4 to 0.8, and is more preferably about 0.6. The magnetic north of each of the magnets 385–400 on the central plate 380 is preferably oriented to point toward one end plate 227 as shown in FIGS. 11, 11A, and 12.

In one preferred embodiment, two opposing magnet sets 226S, 227S of eight magnets are arranged around 12 inch diameter circles. The opposing magnet sets are preferably spaced about 15⅛" apart and the poles are oriented as described above. Additionally, a third set of sixteen magnets is placed on an equatorial circle (i.e., directly transversely centered between the first two magnet sets) whose radius is approximately 9⅜ inches. The equatorial magnets are oriented parallel to the end plates (perpendicular to the non-equatorial magnets), with the fields oriented as shown in FIGS. 11, 11A and 12, and all structural components (magnet holders 250–257, 260–267, end plates 226, 277, 292, 293) comprise aluminum or another non-magnetic material.

Of course, the design described hereinabove can be sized and configured to create a magnetic holding field with a region of homogeneity to substantially encompass one or more chamber(s) which are transported and/or stored. Additional magnets (both more rings and/or more magnets per ring) can make the generated field $B_H$ more homogeneous, while fewer magnets can reduce the size of the region of homogeneity 21M. Preferably, when configuring the spherical magnet approximation, the design is arranged such that it includes rings with an equal number of magnets per ring 226S, 227S (except for equatorial rings, as described hereinabove) positioned at angles $\theta_k$ and tipped at an angle $2\theta_k$ away from the axis of symmetry represented by a line drawn central and parallel to the walls 226, 227 holding the magnet rings thereon.

As noted above, the materials of the device must be chosen such that it minimizes depolarizing activity to the gas. Therefore, all the plates 226, 227, 292, 293, 380, etc., the chamber holder 290, and the magnet holders 250–257 and 260–267 are preferably composed of a non-magnetic material such as aluminum or plastic. Preferably, to minimize weight, a low density, high strength material should be chosen for these components.

Gas Chamber

Preferably, the gas chamber 30 is configured to provide a clinically useful quantity of hyperpolarized gas which can be conveniently delivered to an end point in a user-friendly single dose volume (but of course can also be configured to provide multiple or partial dose quantities) of hyperpolarized gas. In a preferred embodiment,. the gas chamber 30 is a 100–200 cm³ gas spherical chamber. For ³He it is preferred that the gas chamber 30 be pressurized to about 4–12 atmospheres of total pressure, and more preferably it is pressurized to about 5–11 atmospheres of total pressure. Pressuring an appropriately sized gas chamber can allow the hyperpolarized gas to be released through the exit port 31 as the pressure acts to equalize with ambient conditions. Thus, by merely opening the valve 32, the hyperpolarized gas can be directed to a patient or a patient delivery system with minimal handling (and thus minimal potentially depolarizing interaction). Alternatively, the hyperpolarized gas can be divided and/or diluted either at a polarization site or at a second site remote from the polarization site into several patient delivery bags with expandable chambers for (further) transport and delivery. The walls of the expandable chamber bags can be depressed to expel the gas mixture held therein with a minimum of extraction equipment required.

It should be noted that for hyperpolarized ³He, at about 10 atm of pressure, the theoretical $T_1$ due to interactions with other hyperpolarized nuclei is about 75 hours. Substantially higher pressures allow more gas product to be shipped in the container and reduces the sensitivity of the hyperpolarized gas to gradient relaxation, but the gas-gas collision relaxation can become more prevalent. In contrast, for ¹²⁹Xe, it is preferred that the gas pressure be about 10 atm or less, because higher pressures can dramatically reduce the expected relaxation time of the hyperpolarized ¹²⁹Xe (i.e., at 10 atm, the $T_1$ is 5.6 hours). However, as described above, diluting the hyperpolarized noble gas with a second substance of low magnetic moment can significantly decrease the relaxation rate due to gas-gas interactions at high pressures.

In a preferred embodiment of the instant invention, as shown in FIGS. 1 and 4, the gas chamber 30 includes a capillary stem 35 which is sized and configured to minimize the travel of hyperpolarized gas atoms out of the spherical volume and acts to keep most of the hyperpolarized gas away from the valve 32. More specifically, the capillary is dimensioned such that the ratio of the main body volume to the capillary volume, multiplied by the diffusion time of ³He (at fill pressure) to go twice the length of the capillary, is substantially greater than the desired $T_1$. As such, a major portion of the hyperpolarized gas remains in the region of highest homogeneity within the permanent magnet assembly 20 where it is best protected from depolarizing effects during transport. Preferably, the capillary stem 35 includes about a 1.0 mm inside diameter and has a length which is sufficient to allow proper positioning of the sphere within the region of homogeneity in the permanent magnet assembly 20. In the preferred embodiment of the permanent magnet assembly 20 described above, the capillary stem 35 is approximately 4 inches long. As such, for a gas chamber 30 with a three inch diameter sphere, the capillary stem 35 is preferably longer than the than, the sphere holding (body) portion 33 of the gas chamber 30. Also preferably, the inner diameter of the capillary stem 35 is sufficiently small as to slow movement of the hyperpolarized atoms relative to the valve 32, thereby keeping a substantial portion of the hyperpolarized gas in the spherical volume 33 and thus within the high-homogeneity region 21M.

As also discussed above, even if the transport unit 10 shields or protects the hyperpolarized gas from EMI and static magnetic field gradients, the surface relaxation rate associated with the container, the valve(s), and other hyperpolarized gas contacting components can deleteriously affect the polarization lifetime of the hyperpolarized gas. As such, particularly for hyperpolarized ³He, it is preferred that the gas chamber 30 primarily comprise an aluminosilicate material. Aluminosilicate materials have been shown to have long surface relaxation times. The gas chamber 30 may be manufactured from GE180™, although, of course, other aluminosilicates may be used. Typically a transition glass is used to attach the borosilicate (Pyrex®) valve 32 to the aluminosilicate gas chamber 30. A suitable valve 32 for use in the gas chambers 30 is part number 826460-0004 which is available from Kontes, of Vineland, N.J. The valves 32 can be further modified to coat or replace any paramagnetic or ferromagnetic impurities, or may be treated or conditioned to remove or minimize the amount of impure or depolarizing materials that are positioned proximate to the hyperpolarized gas. Suitable transition glass includes uranium glass. Alternatively, other polarization-friendly materials can be used, such as high purity metals or polymers with metallized surfaces, polymers and the like. "High purity" as used herein means materials that are substantially free of paramagnetic or ferrous materials. Preferably, the metallic materials include less than 1 part per million paramagnetic or ferrous impurities (such as iron, nickel, chromium, cobalt and the like). In an alternate preferred embodiment, the gas chamber 30 can be a resilient bag having a metallic film surface or surface layer which is formed from one or a combination of a high purity metal such as gold, aluminum, indium, zinc, tin, copper, bismuth, silver, niobium, and oxides thereof. Additional descriptions of preferred hyperpolarization materials and containers, o-rings and the like are included in co-pending U.S. patent application Ser. No. 09/126,448 entitled "Containers for Hyperpolarized Gases and Associated Methods" and the related co-pending and co-assigned U.S. patent application Ser. No. 09/334,400, as discussed under the Surface-Relaxation section hereinabove. The contents of these applications are hereby incorporated by reference as if recited in full herein.

It is also preferred that the gas chamber 30 be configured as a sphere because it has a geometry that minimizes the surface area/volume ratio and thus the surface-induced contact relaxation. Furthermore, a spherical shape generally maximizes the ratio of chamber volume to region of high magnetic field homogeneity.

In another preferred embodiment, the transport unit 10 and corresponding permanent magnet assembly 20 are configured in at least two different sizes. A first size is designed for transporting large quantities of gas in a single gas chamber 30 configured to hold multiple dosages of hyperpolarized gas or fluid therein ("multi-bolus container") (FIG. 2). A second sized transport unit 10 is configured for transporting one or more (preferably a plurality of single-sized dose bags or containers, as shown in FIGS. 6 and 6A) single-use doses of hyperpolarized substances or formulations to remote sites such that sufficient polarization exists at a remote site to allow clinically useful images. The containers may be rigid or resilient, as shown in FIGS. 6 and 6A, respectively.

The multi-bolus container is used to dispense desired formulations, concentrations, and/or mixtures of the hyperpolarized gas (with or without other substances, liquids, gases (such as nitrogen), or solids) at a remote site. The multi-dose container may be the polarization chamber or optical polarization cell itself. Of course, a single sized transport unit (or even the same transport unit) can be used to transport the hyperpolarized gas to the second and third sites, i. e., the second transport unit may be sized and configured the same as the first transport unit if desired. Alternatively, the first transport unit may be larger than the second or the second may be larger than the first depending on how the hyperpolarized gas is distributed and the shape, size, and number of the second containers positioned for transport from the second site.

In another preferred embodiment, the gas chamber 30 in the middle of the magnetic holding field is the same chamber used to hyperpolarize the gas. With this embodiment, the preferred method of obtaining the gas would be to hyperpolarize gas on a polarizer in an optical chamber, detach the optical chamber from the polarizer, place the optical polarization chamber in the homogeneous region of the magnetic field 21M, transport and/or store the hyperpolarized gas in the transport unit 10, dispense (and dilute if necessary) the hyperpolarized gas from the chamber 30, and use as desired. It is preferable to use the polarization chamber as a chamber during transport because the process can provide improved hyperpolarized gas yields.

Portable Monitoring (NMR Coil/Polarimetry)

Preferably, the transport unit 10 is operably associated with a polarization monitoring system that is configured to monitor the polarization level of the hyperpolarized gas in the gas chamber 30. Advantageously, such system can be used in transit or at a desired evaluation site. For example, prior to release of the gas from the transport unit 10, the monitoring system can acquire a signal corresponding to the polarization level of the hyperpolarized gas in the transport unit 10 and thus indicate the viability of the gas prior to delivery or at a receiving station at the point of use. This can confirm (reliably "inspect") the product and assure that the product meets purchase specification prior to acceptance at the use site.

The polarization monitoring system can also be used with the transport unit 10 to evaluate magnetic holding field fluctuations during transport. Furthermore, the monitoring system can compensate for sub-optimal polarization measurements obtained due to external or internal conditions. This is very important for permanent magnet configurations, because the magnitude of the response of hyperpolarized gas to an RF pulse is frequency-dependent (i.e. dependent on the frequency of the hyperpolarized gas's response). Furthermore, the frequency of the response of the hyperpolarized gas is field strength-dependent. Since the strength of the magnetic field generated from permanent magnets cannot easily be changed to compensate for changes imposed from external sources, this alternative compensation technique is crucial to obtain accurate polarization measurements of the hyperpolarized gas in the transport unit 10. Additional details of a suitable monitoring system and methods for implementing same are discussed in co-pending and co-assigned U.S. patent application Ser. No. 09/334, 341, entitled "Portable Hyperpolarized Gas Monitoring System, Computer Program Products, and Related Methods." The contents of this application are hereby incorporated by reference as if recited in full herein.

As shown in FIG. 4, the transport unit 10 preferably includes a NMR transmit/receive coil 75, which is positioned such that it (securely or firmly) contacts the external wall of the storage chamber 30 where the majority of the gas resides 33. As is known by those of skill in the art, the NMR coil "face" is oriented so that it is perpendicular to the magnetic field lines. The NMR coil 75 includes an input/output line 375 that is operably associated with a NMR polarimetry circuit and a computer (typically an external portable computer device 500, as shown in FIG. 1A). Preferably, the transport unit 10 includes a computer access port 300 which is operably associated with the NMR coil 75 via the coaxial BNC bulkhead 275. The NMR coil 75 can be used with the monitoring system to evaluate the polarization level of the hyperpolarized gas using a substantially non-destructive evaluation technique.

Figure 8:
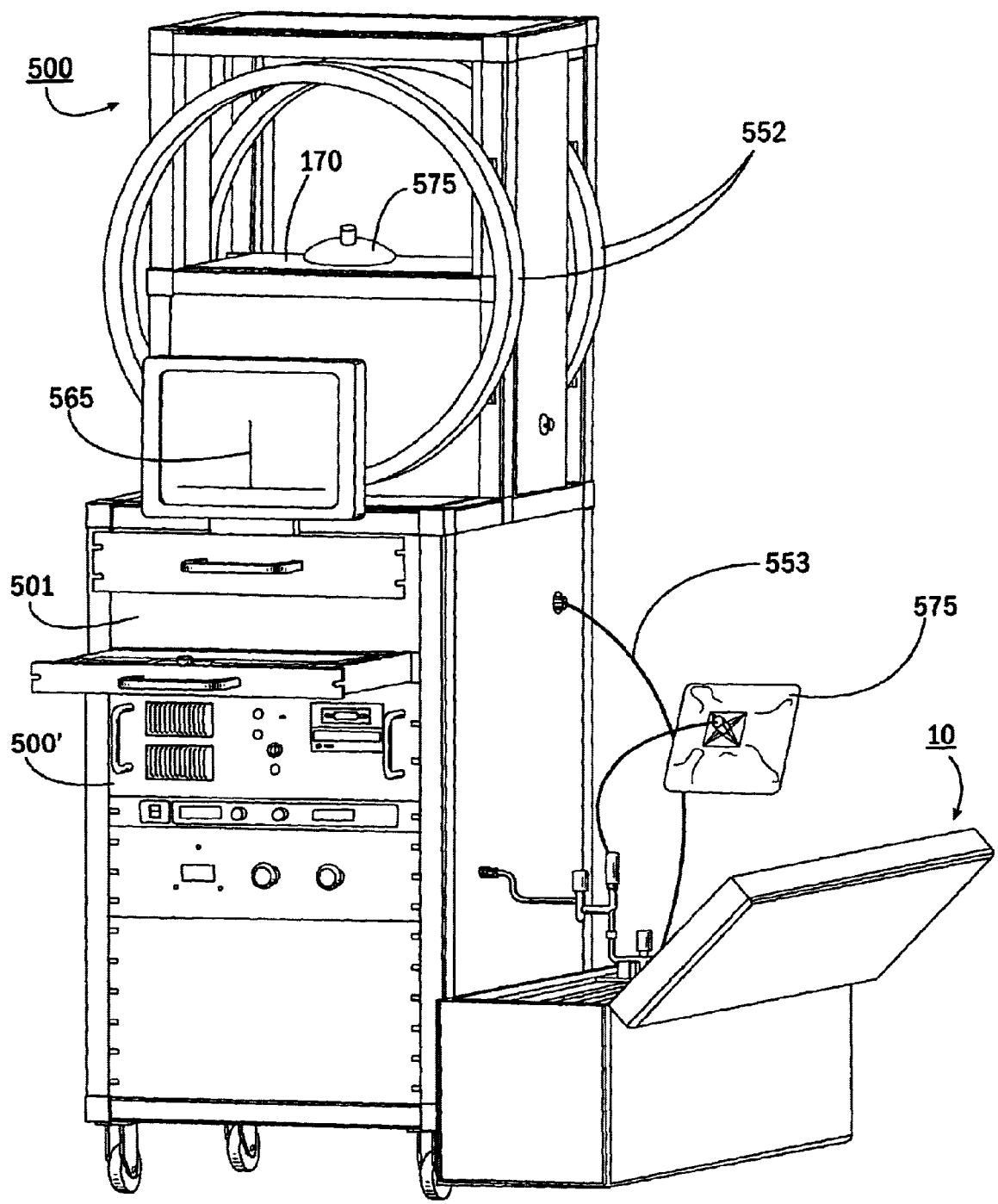
FIG. 8 is a perspective view of a transport unit opened to dispense hyperpolarized gas after storage or transport at a docking station according to the present invention.

Alternatively or in addition to the (portable) monitoring system, the transport unit 10 is preferably configured to conveniently dock into a (remote) site calibration station 500, as shown in FIG. 8. Generally described, as shown in FIG. 8, the polarization detection can be carried out at a calibration station 500 which preferably uses a low-field NMR spectrometer to transmit RF pulses to surface coils 75 positioned proximate to the hyperpolarized gas sample. The spectrometer then receives at least one signal back from the NMR coil 75 corresponding to the hyperpolarized gas. The signal is processed and displayed 565 to determine the polarization level of the hyperpolarized gas (preferably this reading is taken while the gas is contained in the gas chamber 30 within the transport unit 10).

As shown, the calibration station 500 preferably includes a set of Helmholtz coils 552 (preferably of about 24 inches in diameter) to provide a low magnetic field and another external NMR surface coil (not shown). The additional NMR surface coil is preferably sized and configured at about 1 inch in diameter and with about 350 turns. The NMR surface coil is configured to be received into a non-metallic platform 170 and is arranged to be substantially flush with the upper surface of the platform to be able to contact a patient delivery vessel 575. Also, the NMR coil is preferably positioned in the center of the Helmholtz coils 552. The term "low field" as used herein includes a magnetic field under about 100 Gauss. Preferably, the calibration station 500 is configured with a field strength of about 5–40 Gauss, and more preferably a field strength of about 20 Gauss. Accordingly, the corresponding $^3$He signal frequency range is about 16 kHz–128 kHz, with a preferred frequency of about 24 kHz. Similarly, the $^{129}$Xe signal frequency range is about 5.9 kHz–47 kHz, with a preferred signal frequency of about 24 kHz.

Preferably, after being released from the chamber 30, the hyperpolarized gas is contained in a patient delivery container 575 which is positioned on the top surface of the surface coil (not shown) and substantially in the center of the Helmholtz coils 552. Generally described, in operation, a selected RF pulse (of predetermined frequency, amplitude, and duration) is transmitted from the NMR device 501 to the surface coil (not shown). Alternatively, the calibration station 500 can be used to transmit the selected RF pulse inside the transport unit 10 via a cable 553. In any event, the RF pulse frequency corresponds to the field strength of the magnetic field and the particular gas, examples of which are noted above. This RF pulse generates an oscillating magnetic field which misaligns a small fraction of the hyperpolarized $^3$He or $^{129}$Xe nuclei from their static magnetic field alignment. The misaligned nuclei start precessing at their associated Larmour frequency (corresponding to pulse frequency). The precessing spins induce a voltage in the surface coil that can be processed to represent a signal 565. The voltage is received back (typically amplified) at the computer and the signal fits an exponentially decaying sinusoid pattern. As shown, the displayed signal 565 is the Fourier transform of the received signal. The initial peak-to-peak voltage of this signal is directly proportional to polarization (using a known calibration constant). The computer 500' can then calculate the polarization level and generate calculated preferred use dates and times associated with desired polarization levels. As will be recognized by those of skill in the art, other calibration or hyperpolarization level determination methods can also be employed and still be within the product identification and calibration or product-use or expiration determination methods contemplated by the present invention. For example, by detecting the minute magnetic field generated by the polarized $^3$He spins, one can determine a polarization level associated therewith.

In an alternate embodiment, the transport units 10, 10' comprise a plurality of gas chambers 30, 30' (FIGS. 6, 6A) and each gas chamber 30, 30' preferably includes an individual NMR coil which is positioned adjacent each gas chamber within the permanent magnet assembly of the transport unit 10, 10'. It is further preferred that each gas chamber 30 be individually monitorable (individually excitable) for hyperpolarization level and each measurement from each gas chamber 30 is individually compensated for field fluctuations. As shown in FIGS. 6 and 6A, the transport unit 10 can be configured with a single permanent magnet assembly which is sized and configured to surround a plurality of gas chambers 30 therein. When positioning the containers 30 within the transport units (whether for single or multiple gas container units), neck orientation can be oriented in different directions. Further, although the transport units shown in FIGS. 6 and 6A illustrate side by side gas containers, the present invention is not limited thereto. For example, the transport unit can be configured to comprise a plurality of chambers 30 that are stacked longitudinally with capillary stems extending in the same or opposing directions (not shown). As shown in FIGS. 6 and 6A, the chambers used in the transport units can be but are not limited to glass gas chambers. Additionally, as mentioned hereinabove, the dimensions of the permanent magnet transport unit can be changed to accommodate the desired size, number, and type (i.e. resilient or rigid) of chambers needing to be transported or stored.

Central Production Site: Remote Use Site

Use of a remote polarization production site typically requires longer $T_1$'s relative to an on-site polarization apparatus to allow adequate shipping and transport times. However, a centrally stationed polarizer can reduce equipment and maintenance costs associated with a plurality of on-site units positioned at each imaging site and the transport units of the instant invention can allow increased transport times with longer $T_1$ times over those conventionally achieved. In a preferred embodiment, a production polarizer unit (not shown) generates the polarized gas at a production site. The gas chamber 30 is in fluid communication with the polarizer unit such that the polarizer unit produces and directs the polarized gas to the gas chamber 30. Preferably, the gas chamber 30 is held in the transport unit housing 60 (FIG. 1A) during the filling step. After a sufficient quantity of hyperpolarized gas is captured in the gas chamber 30, the valve 32 is then closed (the gas chamber 30 is sealed) and if the chamber 30 is not already positioned in the magnetic field, it (or they, if a plurality of gas chambers are filled simultaneously) is placed in the homogeneous region of the magnetic field 21M. The hyperpolarized gas is shielded from stray magnetic gradients within the transport unit 10 until and after delivery to a remotely located user site. When desired, the hyperpolarized gas can be directed or released from the gas chamber 30 and dispensed to a patient via some patient delivery system (temporally limited to its end use time) such that the hyperpolarized state of the gas at delivery is sufficient to produce useful clinical images.

Preconditioning the Container

Preferably, due to susceptibility of the hyperpolarized gas to paramagnetic oxygen as noted above, the gas chamber 30 is preconditioned to remove contaminants. That is, it is processed to reduce or remove the paramagnetic gases such as oxygen from within the chamber and container walls. For containers made with rigid substrates, such as Pyrex™, UHV vacuum pumps can be connected to the container to extract the oxygen. Alternatively, for rigid and/or resilient containers (such as polymer bag containers), a roughing pump can be used which is typically cheaper and easier than the UHV vacuum pump based process. Preferably, for resilient bag containers, the bag is processed with several purge/pump cycles. Preferably this is accomplished by pumping at or below 40 mtorr for one minute, and then directing clean (UHP) buffer gas (such as Grade 5 nitrogen) into the container at a pressure of about one atmosphere or until the bag is substantially inflated. The oxygen partial pressure is then reduced in the container. This can be done with a vacuum but it is preferred that it be done with nitrogen. Once the oxygen realizes the partial pressure imbalance across the container walls, it will outgas to re-establish equilibrium. Typical oxygen solubilities are on the order of 0.01–0.05; thus, 95–99% of the oxygen trapped in the walls will transition to a gas phase. Prior to use, the container is evacuated, thus harmlessly removing the gaseous oxygen. Unlike conventional rigid containers, polymer bag containers can continue to outgas (trapped gases can migrate therein because of pressure differentials between the outer surface and the inner surface) even after the initial purge/pump cycles. Thus, care should be taken to minimize this behavior, especially when the final filling is not temporally performed with the preconditioning of the container. Preferably, a quantity of clean (UHP) filler gas is directed into the bag (to substantially equalize the pressure between the chamber and ambient conditions) and sealed for storage in order to minimize the amount of further outgassing that may occur when the bag is stored and exposed to ambient conditions. This should substantially stabilize or minimize any further outgassing of the polymer or container wall materials. In any event, the filler gas is preferably removed (evacuated) prior to final filling with the hyperpolarized gas. Advantageously, the container of the instant invention can be economically reprocessed (purged, cleaned, etc.) and reused to ship additional quantities of hyperpolarized gases.

It is also preferred that the container or bag be sterilized prior to introducing the hyperpolarized product therein. As used herein, the term "sterilized" includes cleaning containers and contact surfaces such that the container is sufficiently clean to inhibit contamination of the product so that it is suitable for medical and medicinal purposes. In this way, the sterilized container allows for a substantially sterile and non-toxic hyperpolarized product to be delivered for in vivo introduction into the patient. Suitable sterilization and cleaning methods are well known to those of skill in the art.

With the invention described hereinabove, a noble gas can be hyperpolarized at one site in large quantities and distributed to and diluted at remote sites while still preserving clinically useful levels of polarization for the gas at an imaging site. Advantageously, this invention is lightweight, compact, and does not require power or any other outside input, which makes it more suitable for transport and storage. Further advantageously, the transport unit described in this invention does not require disassembly (thereby potentially compromising the homogeneity) of the magnetic field to insert and/or remove a gas chamber to and from the field. This characteristic is advantageous for transporting multiple doses of gas, during which disassembly of the magnetic field to remove a single dose could deleteriously affect the doses remaining in the magnetic field.

The foregoing is illustrative of the present invention and is not to be construed as limiting thereof. Although a few exemplary embodiments of this invention have been described, those skilled in the art will readily appreciate that many modifications are possible to the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A transport unit for transporting containers of hyperpolarized gas products, comprising:

a housing;

at least four discrete spaced-apart permanent magnets having a width held in said housing, wherein said permanent magnets are configured such that they are symmetrically arranged in spaced-apart relationship about a longitudinally extending axis defining a center therebetween, wherein the discrete magnets are arranged in the housing to form magnet gap spaces between at least a plurality of the adjacently positioned discrete permanent magnets, the respective magnet gap spaces having a width that is greater than the width of the permanent magnets disposed on either side thereof to provide a magnetic holding field with a region of homogeneity substantially centered with respect to the longitudinal axis, wherein each of said discrete permanent magnets is oriented such that the field direction produced thereby is substantially perpendicular to the longitudinal center axis; and at least one container holding a quantity of hyperpolarized gas product positioned in said housing proximate to said region of homogeneity and first and second space-apart opposing end plates formed of a material that is substantially non-depolarizing to the hyperpolarized gas product.

2. A transport unit according to claim 1, wherein said spaced-apart permanent magnets are elongated and positioned in spaced-apart circumferential relationship to longitudinally extend a distance sufficient to define a substantially cylindrical volume projected in space.

3. A transport unit according to claim 1, wherein each of said permanent magnets comprises opposing first and second surfaces, and wherein one of said first and second surfaces is a magnetic north pole and the other a magnetic south pole.

4. A transport unit according to claim 1, wherein said at least one container is a plurality of containers comprising a quantity of hyperpolarized noble gas product therein.

5. A transport unit according to claim 1, wherein said magnetic holding field is a low magnetic field having a region of homogeneity that is at least about $10^{-3}$ cm$^{-1}$.

6. A transport unit for transporting containers of hyperpolarized gas products, comprising:

a housing;

at least four discrete spaced-apart permanent magnets having a width held in said housing, wherein said permanent magnets are configured such that they are symmetrically arranged in spaced-apart relationship about a longitudinally extending axis defining a center therebetween, wherein the discrete magnets are arranged in the housing to form magnet gap spaces between at least a plurality of the adjacently positioned discrete permanent magnets, the respective magnet gap spaces having a width that is greater than the width of the permanent magnets disposed on either side thereof to provide a magnetic field with a region of homogeneity substantially centered with respect to the longitudinal axis, wherein each of said discrete permanent magnets is oriented such that the field direction produced thereby is substantially perpendicular to the longitudinal center axis; and at least one container holding a quantity of hyperpolarized gas product positioned in said housing proximate to said region of homogeneity;

wherein said housing comprises a metallic material configured to define a substantially continuous enclosure with a lid and floor, and wherein said magnets are devoid of contact with the lid and floor.

7. A transport unit for transporting containers of hyperpolarized gas products, comprising:

a housing;

at least four discrete spaced-apart permanent magnets having a width held in said housing, wherein said permanent magnets are configured such that they are symmetrically arranged in spaced-apart relationship about a longitudinally extending axis defining a center therebetween, wherein the discrete magnets are arranged in the housing to form magnet gap spaces between at least a plurality of the adjacently positioned discrete permanent magnets, the respective magnet gap spaces having a width that is greater than the width of the permanent magnets disposed on either side thereof to provide a magnetic field with a region of homogeneity substantially centered with respect to the longitudinal axis, wherein each of said discrete permanent magnets is oriented such that the field direction produced thereby is substantially perpendicular to the longitudinal center axis; and at least one container holding a quantity of hyperpolarized gas product positioned in said housing proximate to said region of homogeneity, wherein said housing includes four upstanding walls, two opposing end walls and two opposing sidewalls, and wherein said at least one container is configured such that a major portion of said container is spatially separated a predetermined distance from each of said four upstanding walls, and wherein said magnets are arranged in the housing such that they do not contact the sidewalls.

8. A transport unit according to claim 7, wherein said discrete magnets have an associated width and thickness of about 0.5 inches, and wherein said discrete magnets are spaced apart about an imaginary circle drawn in space that has a radius of about 8 inches, and wherein said predetermined distance is at least about 2 inches.

9. A transport unit for transporting containers of hyperpolarized gas products, comprising:

first and second spaced-apart opposing end plates formed of a material that is substantially non-depolarizing to hyperpolarized gas;

a plurality of spaced-apart elongated permanent magnets having a width and opposing first and second ends, each of said plurality of permanent magnets positioned to extend linearly in spaced-apart non-contacting relationship between said first and second opposing end plates to provide a magnetic field with a region of homogeneity therebetween, wherein the plurality of elongated magnets define a projected perimeter associated with a line drawn serially through the centers thereof, with the elongated magnets spaced to provide a plurality of gap spaces about the perimeter, and wherein the gap spaces have a width that is greater than the width of the elongated permanent magnet on opposing sides thereof, wherein each of said elongated permanent magnets are oriented and configured to generate a magnetic field in a direction that is substantially perpendicular to the axial direction thereof; and at least one container of hyperpolarized gas product positioned between said first and second end plates within said region of homogeneity.

10. A transport unit according to claim 9, wherein said plurality of spaced apart elongated permanent magnets are positioned in spaced apart circumferential relationship to define a projected cylindrical volume in space, and wherein the magnetic field has a region of homogeneity that is at least about $10^{-3}$ $cm^{-1}$ over a region in space that covers at least about a 3 inch diameter sphere.

11. A transport unit according to claim 9, wherein each of said elongated permanent magnets comprises opposing first and second surfaces, and wherein one of said first and second surfaces is a magnetic north pole and the other a magnetic south pole.

12. A transport unit according to claim 9, wherein said plurality of elongated permanent magnets are flexible magnets.

13. A transport unit according to claim 9, wherein said permanent magnets are rubber strip magnets.

14. A transport unit according to claim 9, wherein said at least one container is a plurality of containers.

15. A transport unit according to claim 9, wherein said plurality of magnets is at least eight.

16. A transport unit according to claim 9, wherein said first and second ends of said elongated permanent magnets are positionally held in alignment and attached to a respective one of said first and second end plates such that when viewed from an end, a perimeter drawn through the center of each of said elongated magnets on each end plate defines a circle with substantially the same radius and a common center axis extending between said first and second end plates, and wherein each of said elongated magnets are spaced apart about the circumference of said circle, whereby said circles are projected along the length of said elongated magnets to define an outer perimeter in space having a cylindrically extending shape associated with the magnetic field generated thereby.

17. A transport unit according to claim 9, wherein said elongated magnets each have opposing first and second surfaces, one configured as a magnetic south pole and the other as a magnetic north pole, and wherein said elongated permanent magnets are substantially circumferentially spaced apart about a circle with a center coincident with a longitudinal center axis extending therethrough, the center of the longitudinal center axis defining the center of a holding volume in said transport unit, and wherein a vertical diametrical line drawn through the center of the circle between the upper and lower points thereof defines a first vertical axis, wherein said elongated magnets are oriented such that the magnetic north pole surface is in a fixed angular relationship with the first vertical axis.

18. A transport unit according to claim 17, wherein each of said elongated magnets is associated with a first angle defining the position of each of said elongated magnets with respect to said first vertical axis, and wherein each of said elongated magnets is associated with a second angle between the direction of its magnetic north and a second vertical axis drawn through the cross sectional center of the magnet, and wherein said first angle is half the magnitude of said second angle for each of said elongated magnets.

19. A transport unit according to claim 17, wherein said elongated magnets are equally spaced-apart about the circle.

20. A transport unit according to claim 9, further comprising a plurality of supplementary magnets positioned on end portions of selected elongated magnets and arranged to enlarge the region of homogeneity therein.

21. A transport unit according to claim 9, wherein said magnetic holding field is a low magnetic field having a region of homogeneity that is at least about $10^{-3}$ cm$^{-1}$.

22. A transport unit for transporting containers of hyperpolarized gas products, comprising:

first and second spaced-apart opposing end plates;

a plurality of spaced-apart elongated permanent magnets having a width and opposing first and second ends, each of said plurality of permanent magnets positioned to extend linearly in spaced-apart non-contacting relationship between said first and second opposing end plates to provide a magnetic field with a region of homogeneity therebetween, wherein the plurality of elongated magnets define a projected perimeter associated with a line drawn serially through the centers thereof, with the elongated magnets spaced to provide a plurality of gap spaces about the perimeter, and wherein the gap spaces have a width that is greater than the width of the elongated permanent magnet on opposing sides thereof; and at least one container, holding a quantity of hyperpolarized gas product positioned between said first and second end plates within said region of homogeneity, wherein said transport unit further comprises at least one support platform for holding said at least one container in a desired position within said transport unit.

23. A transport unit according to claim 22, wherein said transport unit further comprises at least one holder sized and configured to receive a portion of said container therein, said holder positioned on said platform within said transport unit.

24. A transport unit according to claim 23, wherein said holder is a support cup.

25. A transport unit according to claim 23, wherein said holder is a tray configured to slide in and out of said transport unit.

26. A transport unit for transporting containers of hyperpolarized gas products, comprising:

first and second spaced-apart opposing end plates;

a plurality of spaced-apart elongated permanent magnets having a width and opposing first and second ends, each of said plurality of permanent magnets positioned to extend linearly in spaced-apart non-contacting relationship between said first and second opposing end plates to provide a magnetic field with a region of homogeneity therebetween, wherein the plurality of elongated magnets define a projected perimeter associated with a line drawn serially through the centers thereof, with the elongated magnets spaced to provide a plurality of gap spaces about the perimeter, and wherein the gap spaces have a width that is greater than the width of the elongated permanent magnet on opposing sides thereof; and at least one container holding a quantity of hyperpolarized gas product positioned between said first and second end plates within said region of homogeneity, wherein said transport unit further comprises a suspension support member and wherein said at least one container is suspended from said suspension support member.

27. A transport unit for transporting containers of hyperpolarized gas products, comprising:

first and second spaced-apart opposing end plates;

a plurality of spaced-apart elongated permanent magnets having a width and opposing first and second ends, each of said plurality of permanent magnets positioned to extend linearly in spaced-apart non-contacting relationship between said first and second opposing end plates to provide a magnetic field with a region of homogeneity therebetween, wherein the plurality of elongated magnets define a projected perimeter associated with a line drawn serially through the centers thereof, with the elongated magnets spaced to provide a plurality of gap spaces about the perimeter, and wherein the gap spaces have a width that is greater than the width of the elongated permanent magnet on opposing sides thereof; and at least one container holding a quantity of hyperpolarized gas product positioned between said first and second end plates within said region of homogeneity, wherein said plurality of elongated permanent magnets are flexible magnets, and wherein each of said plurality of elongated permanent magnets is structurally secured to a longitudinally extending support member attached to each of said opposing end plates and wherein each of said plurality of magnets is configured to remain fixedly attached to said end plates via said support members during installation and removal of said at least one container into and out of said transport unit.

28. A transport unit for transporting containers of hyperpolarized gas products, comprising:

first and second spaced-apart opposing end plates;

a plurality of spaced-apart elongated permanent magnets having a width and opposing first and second ends, each of said plurality of permanent magnets positioned to extend linearly in spaced-apart non-contacting relationship between said first and second opposing end plates to provide a magnetic field with a region of homogeneity therebetween, wherein the plurality of elongated magnets define a projected perimeter associated with a line drawn serially through the centers thereof, with the elongated magnets spaced to provide a plurality of gap spaces about the perimeter, and wherein the gap spaces have a width that is greater than the width of the elongated permanent magnet on opposing sides thereof;

at least one container holding a quantity of hyperpolarized gas product positioned between said first and second end plates within said region of homogeneity; and a metallic housing which is sized and configured to hold said permanent magnets and end plates therein such that the housing defines a substantially continuous outer surface with four upstanding walls, a lid and a floor, and wherein the permanent magnets are positioned in said housing such that they do not contact the lid, floor, and two of the walls.

29. A transport unit according to claim 28, wherein said metallic housing comprises a lid that is pivotally attached thereto.

30. A transport unit for transporting containers of hyperpolarized gas products, comprising:

first and second spaced-apart opposing end plates;

a plurality of spaced-apart elongated permanent magnets having a width and opposing first and second ends, each of said plurality of permanent magnets positioned to extend linearly in spaced-apart non-contacting relationship between said first and second opposing end plates to provide a magnetic field with a region of homogeneity therebetween, wherein the plurality of elongated magnets define a projected perimeter associated with a line drawn serially through the centers thereof, with the elongated magnets spaced to provide a plurality of gap spaces about the perimeter, and wherein the gap spaces have a width that is greater than the width of the elongated permanent magnet on opposing sides thereof; and at least one container holding a quantity of hyperpolarized gas product positioned between said first and second end plates within said region of homogeneity, wherein said end plates are end walls of a magnetically shielded transport unit defining an enclosed volume for holding said at least one container therein, wherein the transport unit further comprises sidewalls, a lid, and a floor that are attached to said end walls, and wherein, in position, said permanent magnets are spaced apart from the lid, floor, and the sidewalls.

31. A magnet assembly for shielding hyperpolarized gas, comprising:

first and second spaced-apart opposing end plates;

a plurality of spaced-apart elongated magnets having a width and opposing first and second ends, each of said plurality of magnets positioned to attach to and extend between said first and second opposing end plates, wherein the plurality of elongated magnets are arranged on the first and second end plates so that adjacent ones are separated by magnet gap spaces in the axial and transverse directions to provide a magnetic field with a region of homogeneity therebetween, wherein the magnet gap spaces have a width that is greater than the width of the elongated magnets disposed on opposing sides thereof, and wherein each of said elongated permanent magnets is configured to produce a magnetic field that is generally perpendicular to the axial direction thereof; and at least one container of hyperpolarized noble gas disposed in the region of homogeneity in the assembly, wherein the end plates are configured to be substantially non-depolarizing to the hyperpolarized noble gas in the container.

32. A magnet assembly according to claim 31, wherein said plurality of spaced-apart elongated magnets are positioned in spaced-apart circumferential relationship to define a projected substantially cylindrical volume in space.

33. A magnet assembly according to claim 31, wherein each of said elongated magnets comprises opposing few and second surfaces, and wherein one of said first and, second surfaces is a magnetic north pole and the other a magnetic south pole.

34. A magnet assembly according to claim 31, wherein said plurality of elongated magnets are flexible permanent magnets.

35. A magnet assembly according to claim 31, wherein said magnets are elastomeric strip magnets.

36. A magnet assembly according to claim 31, wherein the elongated magnets are spatially separated and arranged in a predetermined relationship so as to form a perimeter that defines an interior space with a homogeneous magnetic field that has a region of homogeneity that is at least about $10^{-3}$ $cm^{-1}$ over a region in space that covers at least about a 3 inch diameter sphere.

37. A magnet assembly according to claim 36, further comprising a plurality of containers holding a quantity of hyperpolarized gas disposed in the interior space.

38. A magnet assembly according to claim 31, wherein said plurality of magnets is at least eight.

39. A magnet assembly according to claim 31, wherein said first and second ends of said elongated magnets are positionally held in alignment and attached to a respective one of said first and second end plates such that when viewed from an end, a perimeter drawn through the center of each of said elongated magnets on each end plate defines a circle with substantially the same radius and a common center axis extending between said first and second end plates, and wherein each of said elongated magnets are spaced apart about the circumference of said circle, whereby said circles are projected along the length of said elongated magnets to define an outer perimeter in space having a cylindrically extending shape associated with the magnetic field generated thereby.

40. A magnet assembly according to claim 39, wherein said elongated magnets each have opposing first and second surfaces, one configured as a magnetic south pole and the other as a magnetic north pole, and wherein said elongated permanent magnets are substantially circumferentially spaced apart about a circle with a center coincident with a longitudinal center axis extending therethrough, the center of the longitudinal center axis defining the center of a holding volume in said transport unit, and wherein a vertical diametrical Mine drawn through the center of the circle between the upper and lower points thereof defines a first vertical axis, wherein said elongated magnets are oriented such that the magnetic north pole surface is in a fixed angular relationship with the first vertical axis.

41. A magnet assembly according to claim 40, wherein each of said elongated magnets is associated with a first angle defining the position of each of said elongated magnets with respect to said first vertical axis, and wherein each of said elongated magnets is associated with a second angle between the direction of its magnetic north and a second vertical axis drawn through the cross sectional center of the magnet, and wherein said first angle is/half the magnitude of said second angle for each of said elongated magnets.

42. A magnet assembly according to claim 41, wherein said elongated magnets are equally spaced-apart about the circle.

43. A magnet assembly according to claim 31, further comprising a plurality of supplementary magnets positioned on end portions of selected elongated magnets and arranged to enlarge the region of homogeneity therein.

44. A magnet assembly according to claim 31, wherein said magnetic field is a low magnetic field having a region of homogeneity that is at least about $10^{-3}$ $cm^{-1}$.

45. A magnet assembly for shielding hyperpolarized gas, comprising:

first and second spaced-apart opposing end plates;

a plurality of spaced-apart elongated magnets having a width and opposing first and second ends, each of said plurality of magnets positioned to attach to and extend between said first and second opposing end plates, wherein the plurality of elongated magnets are arranged on the first and second end plates so that adjacent ones are separated by magnet gap spaces in the axial and transverse directions to provide a magnetic field with a region of homogeneity therebetween, and wherein the magnet gap spaces have a width that is greater than the width of the elongated magnets disposed on opposing sides thereof, and a plurality of longitudinally extending support members, one for each of the elongated magnets, opposing end portions of said longitudinally extending support members being attached to respective opposing end plates, wherein each of said plurality of elongated magnets is structurally secured to the longitudinally extending support member, and wherein each of said plurality of magnets is configured to remain fixedly attached to said end plates during use, wherein the elongated magnets are spatially separated and arranged in a predetermined relationship so as to form a perimeter that defines an interior space with a homogeneous magnetic field, and wherein the assembly further comprises at least one container of hyperpolarized noble gas disposed therein.

46. A magnet assembly for shielding hyperpolarized gas, comprising:

first and second spaced-apart opposing end plates formed of a material that is substantially non-depolarizing to hyperpolarized gas;

a plurality of spaced-apart elongated magnets having a width and opposing first and second ends, each of said plurality of magnets positioned to attach to and extend between said first and second opposing end plates, wherein the plurality of elongated magnets are arranged on the first and second end plates so that adjacent ones are separated by magnet gap spaces in the axial and transverse directions to provide a magnetic field with a region of homogeneity therebetween, and wherein the magnet gap spaces have a width that is greater than the width of the elongated magnets disposed on opposing sides thereof; and at least one container of hyperpolarized gas positioned between said first and second end plates within said region of homogeneity;

a metallic housing with a lid and floor sized and configured to hold said magnets and end plates therein, wherein the magnets are held in the housing such that they are spaced apart from the lid and the floor.

47. A magnet assembly according to claim 46, wherein said metallic housing comprises a releaseably detachable portion.

48. A magnet assembly according to 47, wherein the housing comprises a lid that is pivotally attached thereto to provide the releaseably detachable portion.

49. A transport unit for transporting containers of hyperpolarized gas products, comprising:

a housing;

at least four discrete spaced-apart permanent magnets having a width held in said housing, wherein said permanent magnets are configured such that they are symmetrically arranged in spaced-apart relationship about a longitudinally extending axis defining a center therebetween, wherein the discrete magnets are arranged in the housing to form magnet gap spaces between at least a plurality of the adjacently positioned discrete permanent magnets, the respective magnet gap spaces having a width that is greater than the width of the permanent magnets disposed on either side thereof to provide a magnetic field with a region of homogeneity substantially centered with respect to the longitudinal axis, wherein each of said discrete permanent magnets is oriented such that the field direction produced thereby is substantially perpendicular to the longitudinal center axis; and at least one container holding a quantity of hyperpolarized gas product positioned in said housing proximate to said region of homogeneity, wherein said housing is configured to encase the magnets therein and define an interior chamber, and wherein the housing includes a releaseably detachable portion that can be opened to allow access to the interior chamber.

50. A transport unit according to claim 49, wherein the housing includes four upstanding sidewalls and a floor and lid, and wherein the lid is pivotally attached to at least one of the sidewalls to define the releasebly detachable portion of the housing.

51. A magnet assembly for shielding hyperpolarized gas, comprising:

first and second spaced-apart opposing end plates;

a plurality of spaced-apart elongated magnets having a width and opposing first and second ends, each of said plurality of magnets positioned to attach to and extend between said first and second opposing end plates, wherein the plurality of elongated magnets are arranged on the first and second end plates so that adjacent ones are separated by magnet gap spaces in the axial and transverse directions to provide a magnetic field with a region of homogeneity therebetween, and wherein the magnet gap spaces have a width that is greater than the width of the elongated magnets disposed on opposing sides thereof; and at least one support platform adapted to hold at least one container of hyperpolarized noble gas in a desired position within the interior space, wherein the elongated magnets are spatially separated and arranged in a predetermined relationship so as to form a perimeter that defines an interior space with a homogeneous magnetic field.

* * * * *